US010310333B2

(12) United States Patent
Yasui et al.

(10) Patent No.: US 10,310,333 B2
(45) Date of Patent: Jun. 4, 2019

(54) DOUBLE-SIDED PRESSURE-SENSITIVE-ADHESIVE-LAYER-ATTACHED POLARIZING FILM, AND IMAGE DISPLAY DEVICE

(71) Applicant: NITTO DENKO CORPORATION, Ibaraki-shi, Osaka (JP)

(72) Inventors: Atsushi Yasui, Ibaraki (JP); Shou Takarada, Ibaraki (JP); Shinya Yamamoto, Tokyo (JP); Ryohei Sawazaki, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/579,645

(22) PCT Filed: Jun. 14, 2016

(86) PCT No.: PCT/JP2016/067707
§ 371 (c)(1),
(2) Date: Dec. 5, 2017

(87) PCT Pub. No.: WO2016/204154
PCT Pub. Date: Dec. 22, 2016

(65) Prior Publication Data
US 2018/0157125 A1 Jun. 7, 2018

(30) Foreign Application Priority Data
Jun. 15, 2015 (JP) .................................. 2015-120319

(51) Int. Cl.
*G06F 3/041* (2006.01)
*G02F 1/1337* (2006.01)
(Continued)

(52) U.S. Cl.
CPC ........ *G02F 1/133711* (2013.01); *B32B 27/00* (2013.01); *B32B 27/30* (2013.01);
(Continued)

(58) Field of Classification Search
CPC ......... G02F 1/133711; G02F 1/133528; G02F 1/13338; G02F 1/1335; G02F 1/1333;
(Continued)

(56) References Cited

U.S. PATENT DOCUMENTS

2003/0232192 A1 12/2003 Kishioka et al.
2006/0108050 A1 5/2006 Satake et al.
(Continued)

FOREIGN PATENT DOCUMENTS

JP 2002-348150 A 12/2002
JP 2003-238915 A 8/2003
(Continued)

OTHER PUBLICATIONS

International Search Report dated Aug. 2, 2016, issued in counterpart International Application No. PCT/JP2016/067707 (2 pages).
(Continued)

*Primary Examiner* — Adam R. Giesy
(74) *Attorney, Agent, or Firm* — Westerman, Hattori, Daniels & Adrian, LLP

(57) ABSTRACT

A double-sided pressure-sensitive adhesive-layer-attached polarizing film has a polarizing film nearest to a viewer-side of an image display device among at least one polarizing film, a pressure-sensitive adhesive layer A located on the viewer-side, and a pressure-sensitive adhesive layer B on a side of the polarizing film that is opposite to the pressure-sensitive adhesive layer A. The pressure-sensitive adhesive layers A and B are equipped with separators SA and SB, respectively. The polarizing film is a single-side protected polarizing film having a polarizer of 15 μm or less thickness and having a transparent protective film on only a single side of the polarizer. The pressure-sensitive adhesive layer B is located on the polarizer side of the single-side protected polarizing film. The pressure-sensitive adhesive layer A has a thickness of 25 μm or more; and the pressure-sensitive adhesive layer B has a thickness of 25 μm or less.

14 Claims, 3 Drawing Sheets

(51) Int. Cl.
    *B32B 27/00*     (2006.01)
    *B32B 27/30*     (2006.01)
    *C09J 133/06*    (2006.01)
    *G02F 1/1333*    (2006.01)
    *G02F 1/1335*    (2006.01)
    *G02B 5/30*      (2006.01)
    *H01L 51/52*     (2006.01)
    *C09J 133/08*    (2006.01)
    *C09J 7/38*      (2018.01)
    *C09J 7/22*      (2018.01)
    *G02B 1/16*      (2015.01)

(52) U.S. Cl.
    CPC ............... *C09J 7/22* (2018.01); *C09J 7/385* (2018.01); *C09J 133/06* (2013.01); *C09J 133/08* (2013.01); *G02B 1/16* (2015.01); *G02B 5/3016* (2013.01); *G02B 5/3033* (2013.01); *G02F 1/1333* (2013.01); *G02F 1/1335* (2013.01); *G02F 1/13338* (2013.01); *G02F 1/133528* (2013.01); *H01L 51/5281* (2013.01); *C09J 2201/128* (2013.01); *C09J 2203/318* (2013.01); *C09J 2433/00* (2013.01)

(58) Field of Classification Search
    CPC ...... G02B 5/3033; G02B 1/16; G02B 5/3016; C09J 7/385; C09J 7/22; C09J 133/08; C09J 133/06; C09J 2433/00; C09J 2201/128; C09J 2203/318; H01L 51/5281; B32B 27/30; B32B 27/00; G06F 3/044; G06F 2203/04102
    See application file for complete search history.

(56) References Cited

U.S. PATENT DOCUMENTS

| | | |
|---|---|---|
| 2012/0300299 A1 | 11/2012 | Yasui et al. |
| 2013/0241862 A1 | 9/2013 | Kim et al. |
| 2014/0272200 A1 | 9/2014 | Akizuki et al. |
| 2014/0347730 A1 | 11/2014 | Takeda et al. |
| 2015/0346408 A1 | 12/2015 | Mizutani et al. |
| 2015/0353787 A1* | 12/2015 | Nagata ............... C09J 133/10 524/833 |
| 2016/0124131 A1* | 5/2016 | Kobayashi ........... G02B 5/3016 428/141 |

FOREIGN PATENT DOCUMENTS

| | | |
|---|---|---|
| JP | 2004-170907 A | 6/2004 |
| JP | 2006-53531 A | 2/2006 |
| JP | 2009-57426 A | 3/2009 |
| JP | 2010-24292 A | 2/2010 |
| JP | 2011-227450 A | 11/2011 |
| JP | 2012-237965 A | 12/2012 |
| JP | 2012-247574 A | 12/2012 |
| JP | 2013-77006 A | 4/2013 |
| JP | 2014-502292 A | 1/2014 |
| JP | 2014-115468 A | 6/2014 |
| JP | 2014-119501 A | 6/2014 |
| JP | 2014-178364 A | 9/2014 |
| WO | 2014/208696 A1 | 12/2014 |

OTHER PUBLICATIONS

Notification of Transmittal of Translation of the International Preliminary Report on Patentability (Form PCT/IB/338) issued in counterpart International Application No. PCT/JP2016/067707 dated Dec. 28, 2017 with Forms PCT/IB/373 and PCT/ISA/237 (12 pages).

Office Action dated Apr. 18, 2019, issued in counterpart JP Application No. 2015-120319, with English machine translation. (19 pages).

* cited by examiner

DOUBLE-SIDED PRESSURE-SENSITIVE-ADHESIVE-LAYER-ATTACHED POLARIZING FILM, AND IMAGE DISPLAY DEVICE

TECHNICAL FIELD

The present invention relates to a double-sided pressure-sensitive-adhesive-layer-attached polarizing film in which a pressure-sensitive adhesive layer is provided on both surfaces of a polarizing film which is nearest to a viewer-side of an image display device among at least one polarizing film used in the device. The invention also relates to an image display device in which at a viewer-side thereof, the double-sided pressure-sensitive-adhesive-layer-attached polarizing film is arranged. Examples of the image display device include a liquid crystal display device, an organic EL (electroluminescence) display device, a PDP (plasma display panel), and electronic paper.

The double-sided pressure-sensitive-adhesive-layer-attached polarizing film of the present invention has a pressure-sensitive adhesive layer over each of the two surfaces of a polarizing film. The pressure-sensitive adhesive layer at a viewer-side of the polarizing film is favorably applicable to, for example, a member to be applied to a viewer-side of an image display device, examples of the member including touch panels and other inputting devices, and cover glasses, plastic covers and other transparent substrates. In the meantime, the pressure-sensitive adhesive layer at the side of the film that is opposite to the viewer-side thereof is applied to a display section of the image display device. The polarizing film of the invention is favorably usable for, e.g., optical type, ultrasonic type, static electricity capacitance type or resistance film type one out of the touch panels. The polarizing film is favorably usable, in particular, for a static electricity capacitance type touch panel. The touch panels are each used in, for example, a portable telephone, a tablet computer, or a portable information terminal although the device in which the touch panel is used is not particularly limited.

BACKGROUND ART

About any liquid crystal display device or the like, it is indispensable, from the viewpoint of an image-forming manner thereof, that a polarizer is arranged on each of the two main sides of its liquid crystal cell. A polarizing film is generally bonded, as the polarizer, to each of the sides. In order to bond the polarizing film onto a display section side of the liquid crystal cell or the like, a pressure-sensitive adhesive is usually used. In such a case, the following is generally used since the use produces an advantage that no drying step is required for solidifying a polarizing film to be bonded onto such a display section, and other advantages: a pressure-sensitive-adhesive-layer-attached polarizing film in which a pressure-sensitive adhesive layer is beforehand located onto a single side of a polarizing film. As the pressure-sensitive-adhesive-layer-attached polarizing film, various films are suggested (Patent Documents 1 and 2). In each of these pressure-sensitive-adhesive-layer-attached polarizing films, a pressure-sensitive-adhesive-layer side thereof is fitted to a display section such as a liquid crystal cell. Moreover, it is suggested that in a pressure-sensitive-adhesive-layer-attached polarizing film, a polarizing film having a total thickness of 100 µm or less is used in order to make the image display device thinner (Patent Document 3).

In the meantime, an inputting device such as a touch panel, a transparent substrate such as a cover glass or plastic cover, or some other member is located at the viewer-side of the polarizing films. The member is also generally bonded through a pressure-sensitive adhesive layer to each of the polarizing films (Patent Document 3).

PRIOR ART DOCUMENTS

Patent Documents

Patent Document 1: JP-A-2004-170907
Patent Document 2: JP-A-2006-053531
Patent Document 4: JP-A-2014-178364
Patent Document 4: JP-A-2002-348150

SUMMARY OF THE INVENTION

Problems to be Solved by the Invention

As described in Patent Documents 1 to 3, about a pressure-sensitive-adhesive-layer-attached polarizing film which is nearest to a viewer-side of an image display device among at least one polarizing film used in the device, the pressure-sensitive adhesive layer of this pressure-sensitive-adhesive-layer-attached polarizing film is bonded onto a display section of the device. In the meantime, when a transparent substrate or some other member is located onto the viewer-side of the pressure-sensitive-adhesive-layer-attached polarizing film (to be located nearest to a viewer-side of an image display device among at least one polarizing film used in the device), a pressure-sensitive sheet for an intermediate film is separately prepared as disclosed in Patent Document 4, and then this sheet is bonded, as a pressure-sensitive adhesive layer, onto the polarizing film of the pressure-sensitive-adhesive-layer-attached polarizing film. Furthermore, the transparent substrate or other member is bonded onto the pressure-sensitive adhesive layer. As described herein, when a transparent substrate, or some other member is further bonded onto a polarizing film nearest to a viewer-side of an image display device among at least one polarizing film used in the device, plural processing-steps are required.

As the pressure-sensitive-adhesive-layer-attached polarizing film, Patent Documents 1 to 3 each disclose a polarizing film having, on each of the two surfaces thereof, a pressure-sensitive adhesive layer (full lamination: double-sided pressure-sensitive-adhesive-layer-attached polarizing film). However, when the double-sided pressure-sensitive-adhesive-layer-attached polarizing film is bonded to an adherend (i.e., a transparent substrate or some other member when the adherend is bonded to a viewer-side of the film; or a display section when the adherend is bonded to the opposite side thereof), the film is required to have durability (reliability) under a high-temperature and a high-humidity environment. However, about the pressure-sensitive-adhesive-layer-attached polarizing film disclosed in each of Patent Documents 1 to 3, it is not conceived that a transparent substrate or some other member is used as the adherend. When a transparent substrate or some other member is bonded onto the double-sided pressure-sensitive-adhesive-layer-attached polarizing film disclosed in each of Patent Documents 1 to 3, the pressure-sensitive adhesive layer (at the transparent-substrate- or other-member-bonded side) does not satisfy durability.

Furthermore, a thin polarizer is usable, or a single-side protected polarizing film is usable, which has a transparent protective film on only a single side of a polarizer, in order to make the image display device thinner. However, the single-side protected polarizing film is easily curled since the polarizer has, on only the single side, the transparent protective film. Thus, the single-side protected polarizing film has a problem of being shifted out of position or involving air bubbles incorporated when bonded to some other member. Such a single-side protected polarizing film has a problem of being remarkably lower in strength than any double-side protected polarizing film to have a problem of being largely lowered in reworkability when a defective is generated in the film.

When a single-side protected polarizing film is fitted to a viewer-side of an image display device, it is general to locate a transparent protective film onto the viewer-side to prevent the polarizer from being made naked on the viewer-side.

Thus, an object of the present invention is to provide a double-sided pressure-sensitive adhesive-layer-attached polarizing film which has a pressure-sensitive adhesive layer over each of the two surfaces of a polarizing film nearest to a viewer-side of an image display device among at least one polarizing film used in the device, which makes use of a single-side protected polarizing film as a polarizing film to be made thinner, and which is restrained from being curled and is improvable in reworkability.

Another object of the present invention is to provide an image display device having the double-sided pressure-sensitive-adhesive-layer-attached polarizing film.

Means for Solving the Problems

In order to solve the problems, the inventors have made eager investigations to find out a double-sided pressure-sensitive-adhesive-layer-attached polarizing film described below. Thus, the present invention has been achieved.

The invention relates to a double-sided pressure-sensitive adhesive-layer-attached polarizing film, including a polarizing film nearest to a viewer-side of an image display device among at least one polarizing film used in the device, a pressure-sensitive adhesive layer A located on the viewer-side of the polarizing film, and a pressure-sensitive adhesive layer B on a side of the polarizing film that is opposite to the pressure-sensitive adhesive layer A, the pressure-sensitive adhesive layer A being equipped with a separator SA and the pressure-sensitive adhesive layer B being equipped with a separator SB;

wherein the polarizing film is a single-side protected polarizing film having a polarizer of 15 μm or less thickness and having a transparent protective film on only a single side of the polarizer, and the pressure-sensitive adhesive layer B is located on the polarizer side of the single-side protected polarizing film;

the pressure-sensitive adhesive layer A has a thickness of 25 μm or more; and the pressure-sensitive adhesive layer B has a thickness of 25 μm or less.

In the double-sided pressure-sensitive adhesive-layer-attached polarizing film, the pressure-sensitive adhesive layer B may be bonded directly to the polarizer of the single-side protected polarizing film.

In the double-sided pressure-sensitive adhesive-layer-attached polarizing film, the pressure-sensitive adhesive layer B is preferably bonded to the polarizer of the single-side protected polarizing film to interpose a functional layer of 15 μm or less thickness between the layer B and the polarizer.

In the double-sided pressure-sensitive adhesive-layer-attached polarizing film, the pressure-sensitive adhesive layer A preferably has a storage modulus of 0.05 MPa or more at 23° C.

In the double-sided pressure-sensitive adhesive-layer-attached polarizing film, the edge of the pressure-sensitive adhesive layer A is preferably at least partially positioned inside an end side of the plane of the single-side protected polarizing film.

In the double-sided pressure-sensitive adhesive-layer-attached polarizing film, the separator SA is preferably higher in peel strength than the separator SB.

In double-sided pressure-sensitive adhesive-layer-attached polarizing film, the separator SA preferably has a thickness of 40 μm or more, and further preferably has a separator peel strength of 0.1 N/50-mm or more.

In the double-sided pressure-sensitive adhesive-layer-attached polarizing film, the transparent protective film of the single-side protected polarizing film, over this transparent protective film the pressure-sensitive adhesive layer A being laminated, is preferably subjected to easy facilitating treatment.

In the double-sided pressure-sensitive-adhesive-layer-attached polarizing film, the pressure-sensitive adhesive layer A and the pressure-sensitive adhesive layer B each is preferably obtained from an acrylic pressure-sensitive adhesive including, as a base polymer, a (meth)acryl-based polymer containing, as a monomer unit, an alkyl (meth)acrylate;

the (meth)acryl-based polymer of the pressure-sensitive adhesive layer A preferably includes, as the monomer unit, 30% by weight or more of 2-ethylhexyl acrylate; and the (meth)acryl-based polymer of the pressure-sensitive adhesive layer B preferably includes, as the monomer unit, butyl acrylate in a most proportion.

In the double-sided pressure-sensitive-adhesive-layer-attached polarizing film, the pressure-sensitive adhesive layer A and the pressure-sensitive adhesive layer B each is preferably obtained from an acrylic pressure-sensitive adhesive including, as a base polymer, a (meth)acryl-based polymer containing an alkyl (meth)acrylate as a monomer unit; and at least one of the (meth)acryl-based polymer of the pressure-sensitive adhesive layer A, and the (meth)acryl-based polymer of the pressure-sensitive adhesive layer B preferably includes, as a monomer unit, at least one of (meth)acrylic acid and a cyclic nitrogen-containing monomer.

In the double-sided pressure-sensitive adhesive-layer-attached polarizing film, the pressure-sensitive adhesive layer A is preferably a layer irradiated with an active energy ray to be increased in storage modulus.

In the double-sided pressure-sensitive adhesive-layer-attached polarizing film, the pressure-sensitive adhesive layer A preferably includes an ultraviolet absorbent.

The invention relates to an image display device, including at least one double-sided pressure-sensitive-adhesive-layer-attached polarizing films;

wherein the double-sided pressure-sensitive-adhesive-layer-attached polarizing film nearest to a viewer-side of an image display device among at least one polarizing film used in the device, is the above described double-sided pressure-sensitive-adhesive-layer-attached polarizing film; and the pressure-sensitive adhesive layer A of the double-sided pressure-sensitive-adhesive-layer-attached polarizing film is positioned at the viewer-side, and the pressure-sensitive adhesive layer B of the double-sided pressure-sensitive-adhesive-layer-attached polarizing film is positioned at a display section side of the device.

The image display device is preferably applied to an in-cell or on-cell touch-sensor built-in liquid crystal display device.

In image display devices, at a position at a viewer-side of the devices and outside the polarizing film which is nearest to a viewer-side of an image display device among at least one polarizing film used in the device, a cover glass or any other transparent substrate, or some other member may be arranged. Conventionally, at the viewer-side, a pressure-sensitive adhesive layer and the substrate or other member are successively laminated onto the polarizing film. However, the double-sided pressure-sensitive-adhesive-layer-attached polarizing film of the present invention is a double-sided pressure-sensitive-adhesive-layer-attached polarizing film in which a pressure-sensitive adhesive layer A to be bonded onto a transparent substrate or some other member is located on one surface of a polarizing film while another pressure-sensitive adhesive layer B to be bonded to a display section of an image display device is located on the film surface opposite thereto. The polarizing film has the pressure-sensitive adhesive layer A at a viewer-side thereof also, one of the pressure-sensitive adhesive layers; thus, production-steps of the image display device can be simplified. Moreover, according to the polarizing film, in which the pressure-sensitive adhesive layer is beforehand laid on each of the two surface, by the working of this film into pieces each having a predetermined size, the resultants or the image display device can be improved in productivity and quality.

In the double-sided pressure-sensitive adhesive-layer-attached polarizing film of the present invention, the pressure-sensitive adhesive layer A on the viewer-side is larger in thickness than the pressure-sensitive adhesive layer B on the side of the film that is opposite to the layer A. The pressure-sensitive adhesive layers A and B are equipped, respectively, with the separator SA and the separator SB. This structure makes it possible to restrain the double-sided pressure-sensitive adhesive-layer-attached polarizing film of the invention from being curled although the double-sided pressure-sensitive-adhesive-layer-attached polarizing film is made thin by use of the single-side protected polarizing film. About the double-sided pressure-sensitive adhesive-layer-attached polarizing film of the invention, also in the case of peeling off the separator SB on the pressure-sensitive adhesive layer B side of this film in order to bond the film onto the surface of a display section of an image display device, the film can be restrained from being curled since the film is reinforced by the strength of the pressure-sensitive adhesive layer A itself and the strength of the separator SA attached to the pressure-sensitive adhesive layer A. Furthermore, also when the double-sided pressure-sensitive adhesive-layer-attached polarizing film of the invention is bonded onto the surface of the display section through the pressure-sensitive adhesive layer B, and subsequently required to be reworked, the double-sided pressure-sensitive adhesive-layer-attached polarizing film of the invention is reinforced by the strength of the pressure-sensitive adhesive layer A itself and the strength of the separator SA attached to the pressure-sensitive adhesive layer A. Consequently, the reworking can be satisfactorily attained.

DETAILED DESCRIPTION OF THE PREFERRED EMBODIMENTS

Figure 1A:
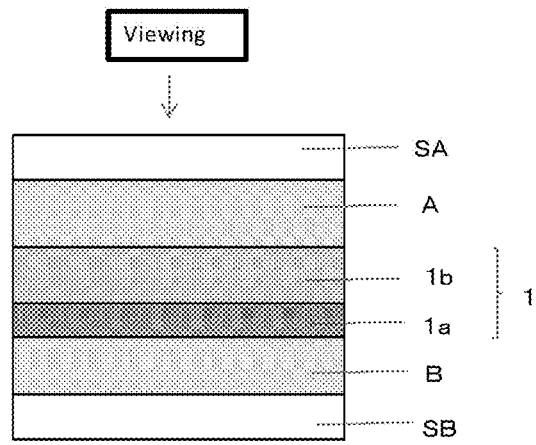
FIG. 1a is a sectional view that schematically illustrates an embodiment of the double-sided pressure-sensitive-adhesive-layer-attached polarizing film of the present invention.

Hereinafter, with reference to the drawings, embodiments of the double-sided pressure-sensitive-adhesive-layer-attached polarizing film and the image display device of the present invention will be detailed in detail. However, the invention is not limited to the embodiments in the drawings.

Figure 1B:
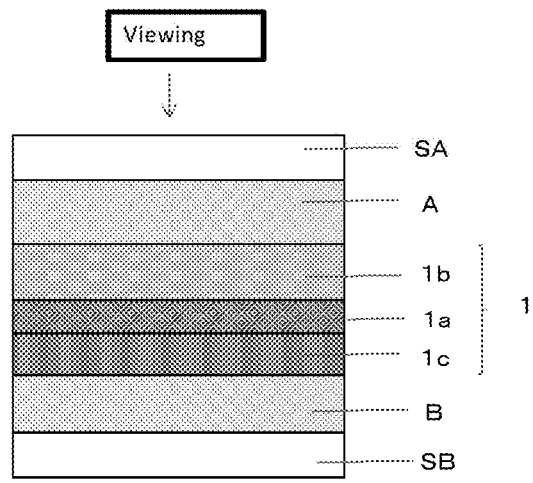
FIG. 1b is a sectional view that schematically illustrates an embodiment of the double-sided pressure-sensitive-adhesive-layer-attached polarizing film of the invention.

As illustrated in each of FIGS. 1a and 1b, a double-sided pressure-sensitive-adhesive-layer-attached polarizing film of an embodiment of the present invention has a single-side protected polarizing film 1, and a pressure-sensitive adhesive layer A and a pressure-sensitive adhesive layer B on the two surfaces of the single-side protected polarizing film 1, respectively. In the double-sided pressure-sensitive adhesive-layer-attached polarizing film of the invention, the pressure-sensitive adhesive layers A and B are equipped, respectively, with a separator SA and a separator SB. The single-side protected polarizing film 1 is a polarizing film having, on only a single side of its polarizer 1a, a transparent protective film 1b. On the polarizer 1a side of the double-sided pressure-sensitive adhesive-layer-attached polarizing film, the pressure-sensitive adhesive layer B is located. FIG. 1a illustrates a case where the pressure-sensitive adhesive layer B is bonded directly to the polarizer 1a of the single-side protected polarizing film 1. FIG. 1b illustrates a case where the pressure-sensitive adhesive layer B is bonded to the polarizer 1a of the single-side protected polarizing film 1 to interpose a functional layer 1c between the pressure-sensitive adhesive layer B and the polarizer 1a.

FIG. 1 demonstrates examples in each of which the pressure-sensitive adhesive layer A is a single layer. However, the pressure-sensitive adhesive layer A may be rendered a multilayered pressure-sensitive adhesive layer having, from the outermost surface side (on the viewer-side) of an image display device, for example, a first pressure-sensitive adhesive layer (a) and a second pressure-sensitive adhesive layer (b) in this order. This pressure-sensitive adhesive layer A is an example in which the multilayered layer is made of two layers. The number of the layers of the multiple pressure-sensitive adhesive layer is preferably from 2 to 4, more preferably from 2 to 3. In the multiple pressure-sensitive adhesive layer, the individual layers are laid to be caused to adhere directly and closely to each other.

Any adjacent two out of the layers of the multiple pressure-sensitive adhesive layer are pressure-sensitive adhesive layers different from each other in composition. However, any two not adjacent to each other, out of the layers, may be pressure-sensitive adhesive layers having the same composition. For example, the first and second pressure-sensitive adhesive layers (a) and (b) have different compositions. In the case of using, from the outermost surface side (on the viewer-side), a first pressure-sensitive adhesive layer (a), a second pressure-sensitive adhesive layer (b) and a third pressure-sensitive adhesive layer (c) as the pressure-sensitive adhesive layer A, the first and second pressure-sensitive adhesive layers (a) and (b) are different in composition from each other, and the second and third pressure-sensitive adhesive layers (b) and (c) are different in composition from each other. The first, second and third pressure-sensitive adhesive layers (a), (b) and (c) may be different from each other in composition; however, the first and third pressure-sensitive adhesive layers (a) and (c) may have the same composition.

Figure 3:
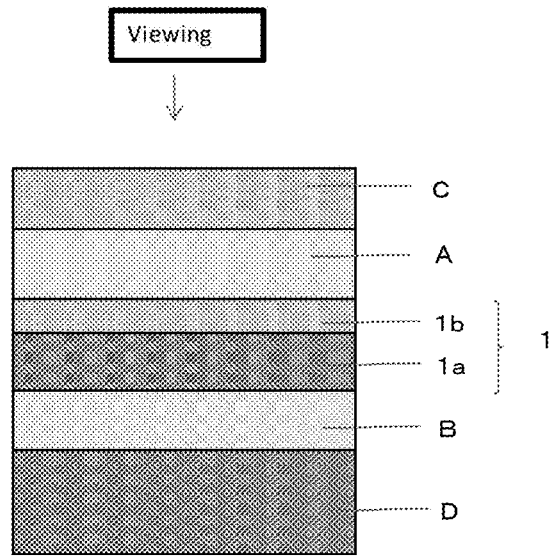
FIG. 3 is a view that schematically illustrates a state that an image display device, and a transparent substrate or some other members are bonded to each other through the double-sided pressure-sensitive-adhesive-layer-attached polarizing film of the invention.

At least one portion of the edge of the pressure-sensitive adhesive layer A, is preferably positioned inwards (or has a structure dented) from an edge side of the plane of the single-side protected polarizing film 1. The adaptation of this structure about the pressure-sensitive adhesive layer A makes it possible to maintain the external appearance of the edge of the pressure-sensitive adhesive layer A satisfactorily, so that the double-sided pressure-sensitive-adhesive-layer-attached polarizing film is good in handleability. For example, when such double-sided pressure-sensitive-adhesive-layer-attached polarizing films are transported, blocking therebetween can be prevented. As illustrated in FIG. 3, when the pressure-sensitive adhesive layer A of the double-sided pressure-sensitive-adhesive-layer-attached polarizing film is applied to a member C, the generation of adhesive residue staining can be restrained. Moreover, when a display area of a display section D of an image display device has a design very close to the size of a package therefor, the image display device can be fabricated without causing the pressure-sensitive adhesive layer A to adhere onto the package, around the display area, by processing the pressure-sensitive adhesive layer A to be positioned inside the edge of the single-side protected polarizing film 1. Also when a transparent substrate or the like of an image display device is a member having a surface having bumps, the pressure-sensitive-adhesive-layer can follow the bumps to be bonded to the member without generating any gap.

The dented structure of the pressure-sensitive adhesive layer A may be formed along all edge sides of the single-side protected polarizing film (pressure-sensitive adhesive layer A), or may be formed along a portion of all the edge sides. When the polarizing film is, for example, rectangular, the pressure-sensitive adhesive layer A can adopt one or more dented structures positioned inside one or more of the four edge sides of the film.

Figure 2:
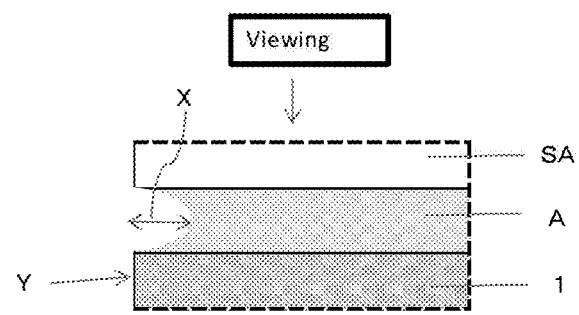
FIG. 2 is an enlarged sectional view that schematically illustrates a form of a pressure-sensitive adhesive layer A in the double-sided pressure-sensitive-adhesive-layer-attached polarizing film of the invention.

FIG. 2 is an enlarged sectional view that schematically illustrates an embodiment of the pressure-sensitive adhesive layer A of the double-sided pressure-sensitive adhesive-layer-attached polarizing film shown in any one of FIG. 1. As illustrated in FIG. 2, the working of the pressure-sensitive adhesive layer A into the dented structure can be represented as an end side Y of a surface of the single-side protected polarizing film 1, and the distance (dented quantity) X from the end side Y of the surface of the single-side protected polarizing film 1 to an end of the pressure-sensitive adhesive layer A which is positioned inward from the end side Y.

In the case of a polarizing film having a diagonal line length of, for example, 10 to 500 ma, the distance X related to the pressure-sensitive adhesive layer A is preferably from 0.01 to 1.5 mm, more preferably from 0.02 to 1 mm. The distance X is measurable through a microscope. When the end of the pressure-sensitive adhesive layer A is curved as illustrated in FIG. 2, the corresponding distance at the center of the end is measured as X.

The dented structure(s) of the pressure-sensitive adhesive layer A can be formed by, for example, a method of making a design to form the pressure-sensitive adhesive layer inwards by a predetermined distance from the edge of a punched-out optical film when a pressure-sensitive adhesive for the layer is applied or transferred onto the film. The dented structure(s) may be formed by a method of a (half-cut) method of applying or transferring the pressure-sensitive adhesive layer onto an optical film, and then removing the adhesive layer only on a region of the layer where the dent(s) is/are to be formed. The dented structure(s) may be formed by a method in which when pressure-sensitive adhesive layers of the pressure-sensitive adhesive layer A is laminated, these layers are appropriately and successively formed onto a separator smaller in area than the single-side protected polarizing film 1 onto which the pressure-sensitive adhesive layer A is to be formed, and finally bonding the layer-laminated separator SA onto the single-side protected polarizing film 1. Moreover, the pressure-sensitive adhesive layer may be made into a state of being protruded from the edge of the single-side protected polarizing film 1 by pressurization, and subsequently cutting the protruded portion.

As illustrated in FIG. 3, the double-sided pressure-sensitive-adhesive-layer-attached polarizing film of the present invention is applied to an image display device. The single-side protected polarizing film of the present double-sided pressure-sensitive-adhesive-layer-attached polarizing film is used as a polarizing film which is nearest to a viewer-side of an image display device among at least one polarizing film used in the device. The pressure-sensitive adhesive layer A of the present double-sided pressure-sensitive-adhesive-layer-attached polarizing film is arranged at the viewer-side of the image display device, and is bonded to a member C, such as a transparent substrate. The pressure-sensitive adhesive layer B is arranged at the side of the single-side protected polarizing film 1 that is opposite to the pressure-sensitive adhesive layer A side, and is bonded to a display section D of the device.

The member C may be a member used at the viewer-side of the image display device, such as a touch panel or any other inputting device, or a cover glass, a plastic cover or any other transparent substrate.

Figure 4A:
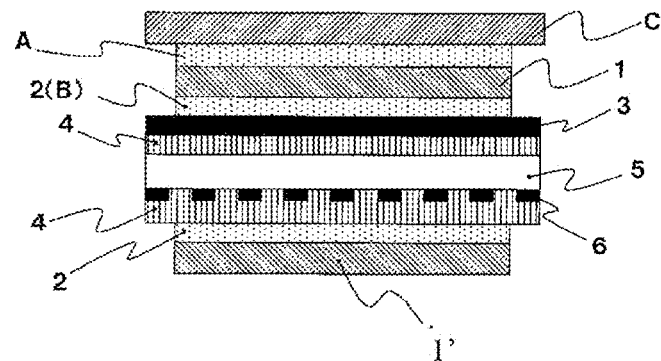
FIG. 4a is a sectional view that schematically illustrates an embodiment of an image display device of the invention.
Figure 4B:
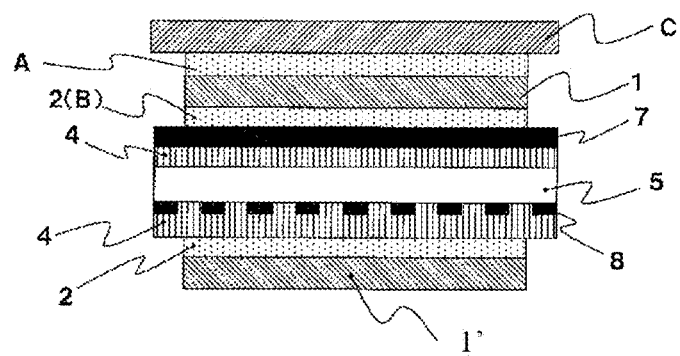
FIG. 4b is a sectional view that schematically illustrates an embodiment of the image display device.
Figure 4C:
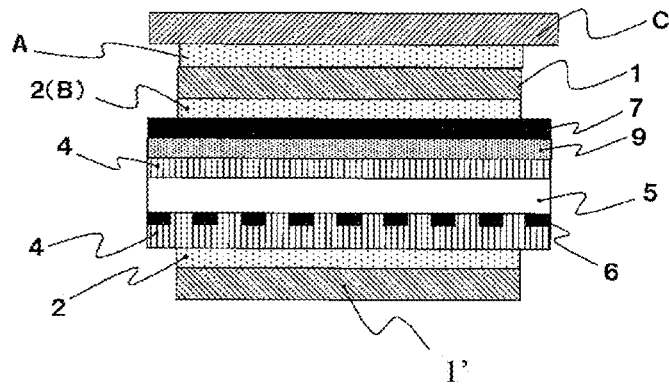
FIG. 4c is a sectional view that schematically illustrates an embodiment of the image display device.

The display section D is a section combined with the single-side protected polarizing film 1 and the same polarizing film(s) to form a section of the image display device, and may be, for example, a liquid crystal display device, an organic EL (electroluminescence) display device, a PDP (plasma display panel), or electric paper. The display section D is used together with the single-side protected polarizing film 1. A liquid crystal display device having a liquid crystal layer is favorably usable. FIGS. 4a to 4c each illustrate, as a schematic sectional view, a typical embodiment of an image display device (liquid crystal display device) to which the double-sided pressure-sensitive-adhesive-layer-attached polarizing film of the present invention is applied. In the image display device (liquid crystal display device) in each of FIGS. 4a to 4c, the single-side protected polarizing film 1 at its upper region is nearest to a viewer-side of an image display device among at least one polarizing film used in the device.

The image display device (liquid crystal display device) illustrated in FIG. 4a has a structure of "cover glass C/pressure-sensitive adhesive layer A/single-side protected polarizing film 1 (at the viewer-side)/pressure-sensitive adhesive layer 2 (B)/antistatic layer 3/glass substrate 4/liquid crystal layer 5/driving electrode 6/glass substrate 4/pressure-sensitive adhesive layer 2/polarizing film 1'". The antistatic layer 3 and the driving electrode 6 may be made of a transparent conductive layer. The antistatic layer 3 is optionally formed.

The image display device (liquid crystal display device) illustrated in FIG. 4b is a device in which a transparent conductive layer is used as an electrode of a touch panel (in-cell type touch panel). The device has a structure of "cover glass C/pressure-sensitive adhesive layer A/single-side protected polarizing film 1 (at the viewer-side)/pressure-sensitive adhesive layer 2 (B)/antistatic layer 7 functioning also as a sensor layer/glass substrate 4/liquid crystal layer 5/driving electrode 8 functioning also as a sensor layer/glass substrate 4/pressure-sensitive adhesive layer 2/polarizing film 1'". The antistatic layer 7 and the driving electrode 8 may each be made of a transparent conductive layer.

The image display device (liquid crystal display device) illustrated in FIG. 4c is a device in which a transparent conductive layer is used as an electrode of a touch panel (on-cell type touch panel). The device has a structure of "cover glass C/pressure-sensitive adhesive layer A/single-side protected polarizing film 1/pressure-sensitive adhesive layer 2 (B)/antistatic layer 7 functioning also as a sensor layer/sensor layer 9/glass substrate 4/liquid crystal layer 5/driving electrode 6/glass substrate 4/pressure-sensitive adhesive layer 2/polarizing film 1'". The antistatic layer 7, the sensor layer 9 and the driving electrode 6 may each be made of a transparent conductive layer.

Additionally, in the image display device, an optical film is appropriately used which is usable to form a liquid crystal display device, an organic EL display device or some other conventional image display device. The optical film may be used as other optical layers, such as a reflective plate, a transflective plate, a retardation plate (a half wavelength plate and a quarter wavelength plate included), an optical compensation film, a viewing angle compensation film and a brightness enhancement film, which may be used for formation of a liquid crystal display device etc. These films may be singly used as the optical film, or one or more thereof may be used in the state of being laminated onto the single-side protected polarizing film when practically used.

In each of FIGS. 4a to 4c, the pressure-sensitive adhesive layer 2 is illustrated, which is to be bonded to the liquid crystal cell (glass substrate), or some other member. The pressure-sensitive adhesive layer 2 at the viewer-side (upper side) of the device when viewed from the liquid crystal cell is used as the pressure-sensitive adhesive layer B. For the pressure-sensitive adhesive layer 2, a pressure-sensitive adhesive that may be of various types is appropriately selected to be used, this adhesive containing, as a base polymer, for example, an acryl-based polymer, silicone polymer, polyester, polyurethane, polyamide, polyether, fluoropolymer, or rubber-based polymer. Particularly preferred is an acryl-based pressure-sensitive adhesive or any other pressure-sensitive adhesive having an excellent optical transparency and an appropriate wettability and showing pressure-sensitive adhesive properties of cohesiveness and adhesion to give weather resistance, heat resistance and other properties.

The liquid crystal display device is generally formed, for example, by fabricating appropriately a liquid crystal cell (having a structure of "glass substrate/liquid crystal layer/ glass substrate"), polarizing films arranged at both sides thereof, respectively, and optional constituents such as a lighting system, and then incorporating a driving circuit to the fabricated body. The liquid crystal cell may be of any type, such as a TN type, STN type, π type, VA type, or IPS type. Moreover, this liquid crystal display device may be rendered an appropriate display device having a lighting system in which a backlight or reflector is used. When the liquid crystal display device is formed, one or more appropriate members may be arranged in the form of one or more layers at one or more appropriate positions of the device. Examples of the member(s) include a diffusion plate, an antiglare layer, an anti-reflection layer, a protective plate, a prism array, a lens array sheet, a light diffusion plate, and a backlight.

The member C may be a touch panel. The touch panel is a static electricity capacitance type touch panel, in which a transparent substrate, a pressure-sensitive adhesive layer 2, and a transparent conductive film are laminated in this order. Two or more transparent conductive films may be laminated. The transparent substrate may have a sensor layer. The transparent substrate may be singly applied, as a cover glass, a plastic cover or some other, to the image display device (liquid crystal display device). A hard coat film may be laid onto the transparent conductive film at the side of the device that is opposite to the transparent substrate side of the touch panel C.

The transparent substrate may be a glass plate or a transparent acrylic plate (PMMA plate). The transparent substrate is the so-called cover glass, and is usable as a decorative panel. The transparent conductive film is preferably a film in which a transparent conductive film is laid on a glass plate or transparent plastic film (in particular, a PET film). The transparent conductive film may be a thin film made of a metal, a metal oxide, or a mixture of the two, and is, for example, a thin film of ITO (indium tin oxide), ZnO, SnO, or CTO (cadmium tin oxide). The thickness of the transparent conductive film is not particularly limited, and may be from about 10 to 200 nm. A typical example of the transparent conductive film is an ITO film in which an ITO membrane is laid on a PET film. The transparent conductive film may be laid through an undercoat layer onto any member. Plural undercoat layers may be laid. An oligomer-shift preventing layer may be laid between the transparent plastic film substrate and the pressure-sensitive adhesive layer. The hard coat film is preferably a film in which a transparent plastic film such as a PET film is subjected to hard coat treatment.

<Polarizing Film>

The single-side protected polarizing film used in the double-sided pressure-sensitive adhesive-layer-attached polarizing film of the present invention may be a polarizing film having, on only a single side of its polarizer, a transparent protective film. The transparent protective film of the single-side protected polarizing film may be provided with a functional layer such as a hard coat layer, an anti-reflection layer, an anti-sticking layer, a diffusion layer, or an antiglare layer. The functional layer such as a hard coat layer, an anti-reflection layer, an anti-sticking layer, a diffusion layer, or an antiglare layer may be provided as part of the transparent protective film itself or as a layer independent of the transparent protective film. The polarizing film 1' illustrated in each of FIGS. 4a to 4c is generally a polarizing film having, on only one or each of the two surfaces of its polarizer, a transparent protective film.

<Polarizer>

The polarizer is not particularly limited, and may be a polarizer of various types. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these polarizers, a polarizer including a polyvinyl alcohol-based film and a dichroic material such as iodine is preferred.

For example, a polarizer including a uniaxially-stretched polyvinyl alcohol-based film dyed with iodine can be produced by a process including immersing a polyvinyl alcohol film in an aqueous iodine solution to dye the film and stretching the film to 3 to 7 times the original length. If necessary, the film may also be immersed in an aqueous solution of potassium iodide or the like optionally containing boric acid, zinc sulfate, zinc chloride, or other materials. If necessary, the polyvinyl alcohol-based film may be further immersed in water for washing before it is dyed. If the polyvinyl alcohol-based film is washed with water, dirt and any anti-blocking agent can be cleaned from the surface of the polyvinyl alcohol-based film, and the polyvinyl alcohol-based film can also be allowed to swell so that unevenness such as uneven dyeing can be effectively prevented. The film may be stretched before, while, or after it is dyed with iodine. The film may also be stretched in an aqueous solution of boric acid, potassium iodide, or the like or in a water bath.

The polarizer used has a thickness of 15 µm or less. In order to reduce the thickness and suppress the occurrence of through cracks, the thickness of the polarizer is preferably 12 µm or less, more preferably 10 µm or less, even more preferably 8 µm or less, further preferably 7 µm or less, further preferably 6 µm or less. On the other hand, the thickness of the polarizer is preferably 2 µm or more, more preferably 3 µm or more, even more preferably 4 µm or more. The polarizer with such a small thickness is less uneven in thickness, has good visibility, and is less dimensionally-variable and thus has high durability to thermal shock.

The thin polarizer, the thickness of which is as small as 15 µm or less, is typically a thin polarizing membrane (polarizer) described in, for example, JP-B1-4751486, JP-B1-4751481, JP-B1-4815544, JP-B1-5048120 or JP-B1-5587517, or WO 2014/077599 or WO 2014/077636 pamphlet; or a thin polarizing membrane (polarizer) yielded by a producing method described in the same.

The polarizer is designed to have a single-body transmittance T and a polarization degree P that represent optical properties satisfying the condition of the following formula: $P > -(10^{0.929T-42.4}-1) \times 100$ (provided that T<42.3) or P≥99.9 (provided that T≥42.3). The polarizer designed to satisfy the condition uniquely has the performance required for a liquid crystal television display having a large display element. Specifically, such a display is required to have a contrast ratio of 1,000:1 or more and a maximum brightness of 500 cd/m² or more. In other applications, for example, the polarizer is bonded to the viewer side of an organic EL display device.

The thin polarizer described above should be produced by a process capable of achieving high-ratio stretching to improve polarizing performance, among processes including the steps of stretching and dyeing a laminate. From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These thin polarizers can be obtained by a process including the steps of stretching a laminate of a polyvinyl alcohol-based resin (hereinafter also referred to as PVA-based resin) layer and a stretchable resin substrate and dyeing the laminate. Using this process, the PVA-based resin layer, even when thin, can be stretched without problems such as breakage by stretching, because the layer is supported on the stretchable resin substrate.

<Transparent Protective Film>

The transparent protective film is preferably made of a material having a high level of transparency, mechanical strength, thermal stability, water barrier properties, isotropy, and other properties. Examples of such a material include polyester-based polymers such as polyethylene terephthalate and polyethylene naphthalate, cellulose-based polymers such as diacetyl cellulose and triacetyl cellulose, acryl-based polymers such as polymethyl methacrylate, styrene-based polymers such as polystyrene and acrylonitrile-styrene copolymers (AS resins), and polycarbonate-based polymers. Examples of polymers that may be used to form the transparent protective film also include polyolefin-based polymers such as polyethylene, polypropylene, cyclo-based or norbornene-structure-containing polyolefin, and ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers.

The transparent protective film may also contain any type of one or more appropriate additives. Examples of such additives include ultraviolet absorbers, antioxidants, lubricants, plasticizers, release agents, discoloration preventing agents, flame retardants, nucleating agents, antistatic agents, pigments, and colorants. The content of the thermoplastic resin in the transparent protective film is preferably from 50 to 100% by weight, more preferably from 50 to 99% by weight, even more preferably from 60 to 98% by weight, further more preferably from 70 to 97% by weight. If the content of the thermoplastic resin in the transparent protective film is 50% by weight or less, high transparency and other properties inherent in the thermoplastic resin may fail to be sufficiently exhibited.

The transparent protective film may also be, for example, a retardation film, a brightness enhancement film, or a diffusion film. The retardation film may have an in-plane retardation of 40 nm or more and/or a thickness direction retardation of 80 nm or more. The in-plane retardation is generally adjusted to fall within the range of 40 to 200 nm, and the thickness direction retardation is generally adjusted to fall within the range of 80 to 300 nm. When a retardation film is used as the transparent protective film, the retardation film can also serve as a polarizer protecting film, which contributes to thickness reduction.

The retardation film may be a birefringent film formed by subjecting a thermoplastic resin film to uniaxial or biaxial stretching. The stretching temperature, the stretch ratio, and other conditions may be appropriately selected depending on the retardation value, the film material, and the thickness.

The thickness of the transparent protective film may be selected as needed. In general, the thickness of the transparent protective film is from about 1 to about 100 µm in view of strength, workability such as handleability, and thin layer formability. In particular, the thickness of the transparent protective film is preferably from 5 to 50 µm, more preferably from 10 to 40 µm for thickness reduction.

<Intervening Layer>

The transparent protective film and the polarizer are laminated with an intervening layer, such as an adhesive layer, a pressure-sensitive adhesive layer, or an undercoat layer (primer layer), between them. In this case, the intervening layer should preferably be used to laminate them with no air gap between them.

The adhesive layer is made from an adhesive. Any of various types of adhesives may be used. The adhesive layer may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

In the process of laminating the polarizer and the transparent protective film, an adhesion-facilitating layer may be placed between the transparent protective film and the adhesive layer. The adhesion-facilitating layer may be made of, for example, any of various resins having a polyester skeleton, a polyether skeleton, a polycarbonate skeleton, a polyurethane skeleton, a silicone skeleton, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

<Functional Layer>

The functional layer can restrain through cracks and nano-slits from being generated in the polarizer while satisfying the following: the single-side protected polarizing film is made thin. The functional layer can be formed from any of various layer-forming materials. The functional layer can be formed by, for example, applying a resin material to the polarizer or vapor-depositing an inorganic oxide such as $SiO_2$ on the polarizer by sputtering or other methods. The functional layer is preferably formed from a resin material so that it can be easily formed.

Examples of the resin material, which the functional layer is made of, include polyester resin, polyether resin, polycarbonate resin, polyurethane resin, silicone resin, polyamide resin, polyimide resin, PVA resin, and acrylic resin. These resin materials may be used singly or in any combination of two or more thereof. Preferred are, out of these resins, one or more selected from the group consisting of polyurethane resin and polyvinyl alcohol (PVA) resin, and more preferred is PVA resin. The resins may be each in the form of any one of an aqueous-based or solvent-based resin. The form of each of the resins is preferably an aqueous-based resin, and is preferably PVA resin. For the aqueous resin, an acrylic resin solution in water or a urethane resin solution in water is usable.

If the functional layer becomes excessively thick, this layer is lowered in optical reliability and water resistance. Thus, the thickness of the functional layer is preferably 15 µm or less, more preferably 10 µm or less, even more preferably 8 µm or less, even more preferably 6 µm or less, even more preferably 5 µm or less, even more preferably 3 µm or less. In the meantime, the thickness of the functional layer is preferably 0.2 µm or more. The functional layer having the thickness can be restrained from being cracked. The thickness of the functional layer is preferably 0.5 µm or more, more preferably 0.7 µm or more.

The total thickness of the single-side protected polarizing film (including, besides the polarizer and the transparent protective film, the interposed layer and the functional layer) is preferably from 3 to 115 µm, more preferably from 43 to 60 µm, even more preferably from 14 to 48 µm.

<Pressure-Sensitive Adhesive Layers>

Hereinafter, a description will be made about the pressure-sensitive adhesive layers A and B in the present invention. The pressure-sensitive adhesive layers A and B are each "transparent". The transparency can be satisfied by the matter that when a pressure-sensitive adhesive layer with a thickness of 25 µm is measured, the layer has a haze value of 2% or less. The haze value is preferably from 0 to 1.5%, more preferably from 0 to 1%.

<Pressure-Sensitive Adhesive Layer Thickness>

The pressure-sensitive adhesive layer A has a thickness of 25 µm or more. The thickness of 25 µm or more is preferred from the viewpoint of dent-absorbing performance and endurance thereof. As the thickness of the pressure-sensitive adhesive layer A is larger, the layer is more preferred for bonding the layer to a touch panel, a transparent substrate, or such a member (particularly, a transparent cover matter having ink dents). In order to cover the ink dents with the layer without generating any air bubble, it is more preferred that the pressure-sensitive adhesive layer A is thicker. The thickness of the pressure-sensitive adhesive layer A is preferably 50 µm or more, even more preferably 100 µm or more. In the meantime, the thickness of any matter related to an image display device is required to be smaller; thus, also about the pressure-sensitive adhesive layer A, required is the smallest thickness permitting the ink dents to be covered with the layer A. The thickness of the pressure-sensitive adhesive layer A is preferably 1 mm or less, more preferably 500 µm or less, even more preferably 300 µm or less from the viewpoint of the workability thereof, and costs.

The pressure-sensitive adhesive layer B has a thickness of 25 µm or less. The thickness of 25 µm or less is preferred from the viewpoint of the reworkability and costs. The pressure-sensitive adhesive layer B is required to ensure reworkability; thus, the thickness thereof is more desirably smaller as far as this layer is not peeled off when used. The thickness of the pressure-sensitive adhesive layer B is preferably 22 µm or less, more preferably 20 µm or less. In the meantime, the thickness of the pressure-sensitive adhesive layer B is preferably 1 µm or more, more preferably 5 µm or more, even more preferably 10 µm or more from the viewpoint of the endurance thereof.

<Storage Modulus of Each of Pressure-Sensitive Adhesive Layers, and Gel Fraction Therein>

The pressure-sensitive adhesive layer A preferably has a storage modulus of 0.05 MPa or more at 23° C. The storage modulus is more preferably from 0.05 to 1 MPa, even more preferably from 0.05 to 0.7 MPa, even more preferably from 0.07 to 0.5 MPa in order that the layer A can satisfy dent-absorbing performance. The gel fraction in the pressure-sensitive adhesive layer A is preferably from 40 to 98% by weight, more preferably from 45 to 85% by weight, even more preferably from 50 to 75% by weight in order that the layer A can be restrained from being peeled off from an adherend onto the layer.

The pressure-sensitive adhesive layer A may include an active-energy-ray curing adhesive layer. When the pressure-sensitive adhesive layer A includes the active-energy-ray curing adhesive layer, an active-energy-ray curing adhesive is irradiated with an active energy ray (first curing: irradiation) to permit the pressure-sensitive adhesive layer A to be formed. An active-energy-ray curing adhesive is heated and dried (first curing: heating) to permit the pressure-sensitive adhesive layer A to be formed. About the pressure-sensitive adhesive layer A formed by applying the first curing (irradiation, or heating and drying) to the active-energy-ray curing adhesive, from the viewpoint of the dent-absorbing performance, the storage modulus is preferably from 0.05 to 0.6 MPa, more preferably from 0.05 to 0.6 MPa, and the gel fraction is preferably from 40 to 80% by weight, more preferably from 45 to 70% by weight.

The pressure-sensitive adhesive layer A formed by applying the first curing (irradiation, or heating and drying) to the active-energy-ray curing adhesive is bonded to the member C (for example, a transparent substrate such as a cover glass piece). After the bonding, the pressure-sensitive adhesive layer A may be further irradiated with the active energy ray (second curing). By the second curing, the pressure-sensitive adhesive layer A' to which the second curing has been applied (the active-energy-ray curing adhesive layer) can be varied (or improved) in gel fraction and storage modulus from the pressure-sensitive adhesive layer A subjected to the first curing, so as to be heightened in heating reliability. The storage modulus of the pressure-sensitive adhesive layer A' subjected to the second curing is preferably from 0.05 to 1 MPa, more preferably from 0.08 to 0.8 MPa, and the gel fraction therein is preferably from 60 to 98% by weight, more preferably from 70 to 95% by weight.

About the pressure-sensitive adhesive layer A formed by applying the first curing (irradiation, or heating and curing) to the active-energy-ray curing adhesive as described above, the storage modulus can be increased by irradiating this layer A with the active energy ray (second curing). The difference between the storage modulus after the second curing and that after the first curing ("the storage modulus after the second curing"–"that after the first curing") is preferably 0.01 MPa or more, more preferably 0.03 MPa or more. The difference between the gel fraction after the second curing and that after the first curing ("the gel fraction after the second curing"–"that after the first curing") is preferably 5% or more by weight, more preferably 10% or more by weight. About the storage modulus related to the storage modulus difference associated with the second curing, a standard of the measuring temperature thereof is 50° C.

Usually, in the pressure-sensitive adhesive layer B, an active-energy-ray curing adhesive layer is not used. About the pressure-sensitive adhesive layer B, the storage modulus at 23° C. is preferably from 0.01 to 1.0 MPa, more preferably from 0.05 to 0.7 MPa, even more preferably from 0.07 to 0.5 MPa in order that the layer B can satisfy workability, storability and endurance. In the pressure-sensitive adhesive layer B, the gel fraction is preferably from 40 to 95% by weight, more preferably from 45 to 90% by weight, even more preferably from 60 to 85% by weight to restrain the layer B from being peeled off from the adherend.

<Peel Strength of Each of Pressure-Sensitive Adhesive Layers>

The pressure-sensitive adhesive layers A and B are equipped, respectively, with separator SA and the separator SB. About the double-sided pressure-sensitive adhesive-layer-attached polarizing film of the present invention, the pressure-sensitive adhesive layer B side thereof is initially bonded to a display section (panel) of an image display device. If the peel strength of the separator SA is small, the separator SA and the pressure-sensitive adhesive layer A may be unfavorably peeled from each other when the polarizing film of the present invention is reworked. Consequently, the reworking may not be attained. From the viewpoint of the reworking, the peel strength of the separator SA from the pressure-sensitive adhesive layer A is preferably 0.1N/50 mm or more. The peel strength is more preferably from 0.1 to 5 N/50 mm, even more preferably from 0.1 to 2 N/50 mm, even more preferably from 0.1 to 1 N/50 mm. The peel strength of the separator SB from the pressure-sensitive adhesive layer B is preferably from 0.01 to 1 N/50 mm, more preferably from 0.03 to 0.2 N/50 mm, even more preferably from 0.05 to 0.2 N/50 mm, even more preferably from 0.07 to 0.15 N/50 mm. When the pressure-sensitive adhesive layer includes the active-energy-ray curing adhesive layer, the peel strength of the separator SA is a value measured after the first curing.

The peel strength of the separator SA is preferably adjusted to be higher than that of the separator SB in order to bond the pressure-sensitive adhesive layer B earlier onto the panel. The difference in peel strength between the separator SA and the separator SB is preferably from 0.01 to 2 N/50 mm, more preferably from 0.02 to 1 N/50 mm to prevent a peel failure of the double-sided pressure-sensitive adhesive-layer-attached polarizing film.

Respective measurements of the above-mentioned storage moduli, gel fractions, and peel strengths are based on the description of working examples. The pressure-sensitive adhesive layer A may be made of plural pressure-sensitive adhesive layers; also in this case, in accordance with the description of the working examples, the storage modulus and the gel fraction are measured, respectively, through a dynamic viscoelasticity measuring instrument and by a mesh method.

<Material of Pressure-Sensitive Adhesive Layer>

A material for forming each of the pressure-sensitive adhesive layers A and B in the present invention may be a material containing a base polymer that may be of various types. The type of the base polymer is not particularly limited, and examples thereof include rubber-based polymer, (meth)acryl-based polymer, silicone-based polymer, urethane-based polymer, vinyl alkyl ether-based polymer, polyvinyl alcohol-based polymer, polyvinyl pyrrolidone-based polymer, polyacrylamide-based polymer, and cellulose-based polymer.

It is preferred to use, out of these base polymers, any polymer that is excellent in optical transparency, and shows an appropriate wettability and adhesive properties of cohesiveness and adhesion to be excellent in weather resistance, heat resistance and other properties. A polymer showing such characteristics is preferably (meth)acryl-based polymer. Hereinafter, a description will be made about a material for forming the pressure-sensitive adhesive layers A and B, i.e., an acrylic pressure-sensitive adhesive containing, as a base polymer, a (meth)acrylic polymer containing an alkyl (meth)acrylate as a monomer unit.

The (meth)acryl-based polymer is obtained by polymerizing one or more monomer components, the component(s) being/including an alkyl (meth)acrylate having an alkyl group of 4 to 24 carbon atoms at the ester end. As used herein, the term "alkyl (meth)acrylate" refers to alkyl acrylate and/or alkyl methacrylate, and "(meth)" is used in the same meaning in the description.

Examples of the alkyl (meth)acrylate include (meth)acrylates each having a linear or branched alkyl group of 4 to 24 carbon atoms. These alkyl (meth)acrylate may be used alone or in a mixture of two or more The alkyl (meth)acrylate is, for example, an alkyl (meth) acrylate having a branched alkyl group of 4 to 9 carbon atoms. This alkyl (meth)acrylate is preferred since the resultant polymer easily takes a good balance between adhesive properties. Examples thereof include n-butyl (meth)acrylate, s-butyl (meth)acrylate, t-butyl (meth)acrylate, isobutyl (meth)acrylate, n-pentyl (meth)acrylate, isopentyl (meth)acrylate, isohexyl (meth)acrylate, isoheptyl (meth)acrylate, 2-ethylhexyl (meth)acrylate, isooctyl (meth) acrylate, and isononyl (meth)acrylate.

The (meth)acryl-based polymer for the pressure-sensitive adhesive layer A preferably contains, as a monomer unit, 2-ethylhexyl acrylate is 30% by weight or more based on the total weight of the monomer component used to form the (meth)acryl-based polymer from the viewpoint of the control of the storage modulus and the dent-absorbing capability. When the pressure-sensitive adhesive layer A is a multiple pressure-sensitive adhesive layer containing at least a first pressure-sensitive adhesive layer (a) and a second pressure-sensitive adhesive layer (b), it is preferred about the multiple pressure-sensitive adhesive layer that its (meth) acryl-based polymer preferably contains, as a monomer unit, 2-ethylhexyl acrylate is 30% by weight or more based on the total weight of the monomer component used to form the (meth)acryl-based polymer (in the whole of the individual layers). In the meantime, it is preferred that the (meth)acryl-based polymer for the pressure-sensitive adhesive layer B contains, as a monomer unit, butyl acrylate in a most proportion to control the storage modulus of the pressure-sensitive adhesive layer B while the film satisfies workability, storability and durability.

In the present invention, the content of the above-mentioned alkyl (meth)acrylate having an alkyl group of 4 to 24 carbon atoms at the ester end is 40% by weight or more, preferably 50% by weight or more, more preferably 60% by weight or more based on the total weight of the monofunctional monomer component used to form the (meth)acryl-based polymer. The use thereof in the content of 40% or more by weight is preferred since the resultant polymer easily takes a good balance between adhesive properties.

The monomer components for forming the (meth)acryl-based polymer in the present invention may include, as a monofunctional monomer, a copolymerizable monomer other than the alkyl (meth)acrylate. The copolymerizable monomer is usable as a component other than the alkyl (meth)acrylate in the monomer components.

The copolymerizable monomers, for example, may include a cyclic nitrogen-containing monomer. Any monomer having a cyclic nitrogen structure and an unsaturated double bond-containing polymerizable functional group such as a (meth)acryloyl group or a vinyl group may be used without restriction as the cyclic nitrogen-containing monomer. The cyclic nitrogen structure preferably has a nitrogen atom in the cyclic structure. Examples of the cyclic nitrogen-containing monomer include vinyl lactam monomers such as N-vinylpyrrolidone, N-vinyl-ε-caprolactam, and methylvinylpyrrolidone; and nitrogen-containing heterocyclic vinyl monomers such as vinylpyridine, vinylpiperidone, vinylpyrimidine, vinylpiperazine, vinylpyrazine, vinylpyrrole, vinylimidazole, vinyloxazole, and vinylmorpholine. The cyclic nitrogen-containing monomer may also be a (meth) acrylic monomer having a heterocyclic ring such as a morpholine ring, a piperidine ring, a pyrrolidine ring, or a piperazine ring. Examples include N-acryloyl morpholine, N-acryloyl piperidine, N-methacryloyl piperidine, and N-acryloyl pyrrolidine. Among them, vinyl lactam monomers are preferred, in view of dielectric constant and cohesiveness.

In the present invention, the content of the cyclic nitrogen-containing monomer is 40% by weight or less, more preferably from 0.5 to 40% by weight, even more preferably from 0.5 to 30% by weight based on the total weight of the monomer component used to form the (meth)acryl-based polymer. The use of the cyclic nitrogen-containing monomer in the range is preferred for the control of the surface resistance value of the pressure-sensitive-adhesive-layer and, in particular, the compatibility of the monomer with an ionic compound when this compound is used in any one of the pressure sensitive adhesive layers, and the durability of the antistatic function of the film.

The monomer component used to form the (meth)acryl-based polymer according to the invention may further include other functional group-containing monomers as a monofunctional monomer. The functional group-containing monomers include a hydroxyl group-containing monomer, a carboxyl group-containing monomer, and a cyclic ether group-containing monomer.

Any monomer having a hydroxyl group and an unsaturated double bond-containing polymerizable functional group such as a (meth)acryloyl group or a vinyl group may be used without restriction as the hydroxyl group-containing monomer. Examples of the hydroxyl group-containing monomer include hydroxyalkyl (meth)acrylate such as 2-hydroxyethyl (meth)acrylate, 2-hydroxypropyl (meth)acrylate, 2-hydroxybutyl (meth)acrylate, 3-hydroxypropyl (meth) acrylate, 4-hydroxybutyl (meth)acrylate, 6-hydroxyhexyl (meth)acrylate, 8-hydroxyoctyl (meth)acrylate, 10-hydroxydecyl (meth)acrylate, or 12-hydroxylauryl (meth)acrylate; and hydroxyalkylcycloalkane (meth)acrylate such as (4-hydroxymethylcyclohexyl)methyl (meth)acrylate. Other examples include hydroxyethyl(meth)acrylamide, allyl alcohol, 2-hydroxyethyl vinyl ether, 4-hydroxybutyl vinyl ether, and diethylene glycol monovinyl ether. These may be used alone or in any combination. Among them, hydroxyalkyl (meth)acrylate is preferred.

Any monomer having a carboxyl group and an unsaturated double bond-containing polymerizable functional group such as a (meth)acryloyl group or a vinyl group may be used without restriction as the carboxyl group-containing monomer. Examples of the carboxyl group-containing monomer include (meth)acrylic acid, carboxyethyl (meth) acrylate, carboxypentyl (meth)acrylate, itaconic acid, maleic acid, fumaric acid, crotonic acid, and isocrotonic acid. These may be used alone or in any combination. Itaconic acid or maleic acid can be used in the form of an anhydride. Among these, acrylic acid and methacrylic acid are preferred, and acrylic acid is particularly preferred. In the invention, a carboxyl group-containing monomer may be or may not be used as an optional monomer to produce the (meth)acryl-based polymer. An adhesive containing a (meth)acryl-based polymer obtained from a monomer composition free of any carboxyl group-containing monomer can form a pressure-sensitive adhesive layer with reduced ability to corrode metals, because the ability to corrode metals would be due to any carboxyl group.

Any monomer having a cyclic ether group such as an epoxy group or an oxetane group and an unsaturated double bond-containing polymerizable functional group such as a (meth)acryloyl group or a vinyl group may be used without restriction as the cyclic ether group-containing monomer. Examples of the epoxy group-containing monomer include glycidyl (meth)acrylate, 3,4-epoxycyclohexylmethyl (meth)

acrylate, and 4-hydroxybutyl(meth)acrylate glycidyl ether. Examples of the oxetane group-containing monomer include 3-oxetanylmethyl (meth)acrylate, 3-methyl-oxetanylmethyl (meth)acrylate, 3-ethyl-oxetanylmethyl (meth)acrylate, 3-butyl-oxetanylmethyl (meth)acrylate, and 3-hexyl-oxetanylmethyl (meth)acrylate. These monomers may be used alone or in any combination.

In the invention, the content of the hydroxyl group-containing monomer, carboxyl group-containing monomer, and cyclic ether group-containing monomer is preferably 30% by weight or less, more preferably 27% by weight or less, further preferably 25% by weight or less, based on the total weight of the monofunctional monomer component used to form the (meth)acryl-based polymer.

An example of one of the monomer components for forming the (meth)acryl-based polymer in the present invention is an alkyl (meth)acrylate, as the copolymerizable monomer, represented by $CH_2=C(R^1)COOR^2$ wherein $R^1$ represents hydrogen or a methyl group, and $R^2$ represents a unsubstituted or substituted alkyl group of 1 to 3 carbon atoms, or a cyclic alkyl group.

The unsubstituted or substituted alkyl group of 1 to 3 carbon atoms represented by $R^2$ may be a linear, or branched alkyl group. The substituted alkyl group preferably has an aryl group of 3 to 8 carbon atoms or an aryloxy group of 3 to 8 carbon atoms as a substituent. The aryl group is preferably, but not limited to, a phenyl group.

Examples of the monomer represented by $CH_2=C(R^1)COOR^2$ include methyl (meth)acrylate, ethyl (meth)acrylate, phenoxyethyl (meth)acrylate, benzyl (meth)acrylate, cyclohexyl (meth)acrylate, 3,3,5-trimethylcyclohexyl (meth)acrylate, and isobornyl (meth)acrylate. These monomers may be used alone or in any combination.

In the invention, the content of the (meth)acrylate represented by $CH_2=C(R^1)COOR^2$ may be 40% by weight or less, preferably 35% by weight or less, more preferably 30% by weight or less, based on the total weight of the monofunctional monomer component used to form the (meth)acryl-based polymer.

Other copolymerizable monomers that may also be used include vinyl acetate, vinyl propionate, styrene, α-methylstyrene; glycol acrylic ester monomers such as polyethylene glycol (meth)acrylate, polypropylene glycol (meth)acrylate, methoxyethylene glycol (meth)acrylate, and methoxypolypropylene glycol (meth)acrylate; and acrylate ester monomers such as tetrahydrofurfuryl (meth)acrylate, fluoro (meth)acrylate, silicone (meth)acrylate, and 2-methoxyethyl acrylate; amide group-containing monomers, amino group-containing monomers, imide group-containing monomers, N-acryloyl morpholine, and vinyl ether monomers. Cyclic structure-containing monomers such as terpene (meth)acrylate and dicyclopentanyl (meth)acrylate may also be used as copolymerizable monomers. Among these, vinyl acetate is preferred in view of improving cohesive strength and adhesive strength.

Besides the above, a silicon atom-containing silane monomer may be exemplified as the copolymerizable monomer. Examples of the silane monomers include 3-acryloxypropyltriethoxysilane, vinyltrimethoxysilane, vinyltriethoxysilane, 4-vinylbutyltrimethoxysilane, 4-vinylbutyltriethoxysilane, 8-vinyloctyltrimethoxysilane, 8-vinyloctyltriethoxysilane, 10-methacryloyloxydecyltrimethoxysilane, 10-acryloyloxydecyltrimethoxysilane, 10-methacryloyloxydecyltriethoxysilane, and 10-acryloyloxydecyltriethoxysilane.

The copolymerizable monomer is appropriately selectable when the (meth)acryl-based polymer is prepared in the formation of each of the pressure-sensitive adhesive layers A and B. When the first pressure-sensitive adhesive layer (a) in the pressure-sensitive adhesive layer A, and the pressure-sensitive adhesive layer B are made of an acrylic pressure-sensitive adhesive, at least one of these layers preferably contains, as a monomer unit, at least one of (meth)acrylic acid and a nitrogen-containing monomer in view of improving cohesive strength and adhesive strength.

In the invention, if necessary, the monomer component used to form the (meth)acryl-based polymer may contain a polyfunctional monomer for controlling the cohesive strength of the pressure-sensitive adhesive in addition to the monofunctional monomers listed above.

The polyfunctional monomer is a monomer having at least two polymerizable functional groups with an unsaturated double bond such as (meth)acryloyl group or vinyl group, and examples thereof include ester compounds of a polyhydric alcohol with (meth)acrylic acid such as (poly)ethylene glycol di(meth)acrylate, (poly)propylene glycol di(meth)acrylate, neopentyl glycol di(meth)acrylate, pentaerythritol di(meth)acrylate, pentaerythritol tri(meth)acrylate, propoxylated pentaerythritol triacrylate, dipentaerythritol hexa(meth)acrylate, 1,2-ethyleneglycol di(meth)acrylate, 1,6-hexanediol di(meth)acrylate, 1,12-dodecanediol di(meth)acrylate, trimethylolpropane tri(meth)acrylate, tetramethylolmethane tri(meth)acrylate; allyl (meth)acrylate, vinyl (meth)acrylate, divinylbenzene, epoxy acrylate, polyester acrylate, urethane acrylate, butanediol di(meth)acrylate, hexanediol di(meth)acrylate, and the like. Among them, trimethylolpropane tri(meth)acrylate, hexanediol di(meth)acrylate, and dipentaerythritol hexa(meth)acrylate can be preferably used. The polyfunctional monomer can be used alone or in combination of two or more.

The use amount of the polyfunctional monomer is varied in accordance with the molecular weight thereof and the number of functional groups thereof, and is preferably 3 parts by weight or less, more preferably 2 parts by weight or less, even more preferably 1 part by weight or less based on 100 parts by weight of the whole of the monofunctional monomer(s). The low limit value thereof is not particularly limited, and is preferably 0 part by weight or more, more preferably 0.001 part by weight or more. When the use amount of the polyfunctional monomer is in the range, the layers can be improved in adhering strength.

The (meth)acryl-based polymer described above can be produced using a method appropriately selected from known production methods, such as solution polymerization, radiation polymerization such as ultraviolet ray polymerization, bulk polymerization, and various radical polymerization methods including emulsion polymerization. The resultant (meth)acryl-based polymer may be any of a random copolymer, a block copolymer, a graft copolymer, or any other form.

Any appropriate polymerization initiator, chain transfer agent, emulsifying agent and so on may be selected and used for radical polymerization. The weight average molecular weight of the (meth)acryl-based polymer may be controlled by the reaction conditions including the amount of addition of the polymerization initiator or the chain transfer agent. The amount of the addition may be controlled as appropriate depending on the type of these materials.

In a solution polymerization process and so on, for example, ethyl acetate, toluene or the like is used as a polymerization solvent. In a specific solution polymerization process, for example, the reaction is performed under a stream of inert gas such as nitrogen at a temperature of about 50 to about 70° C. for about 5 to about 30 hours in the presence of a polymerization initiator.

Examples of the thermal polymerization initiator used for the solution polymerization process include, but are not limited to, azo initiators such as 2,2'-azobisisobutyronitrile, 2,2'-azobis-2-methylbutyronitrile, 2,2'-azobis(2-methylpropionic acid) dimethyl, 4,4'-azobis-4-cyanovaleric acid, azobisisovaleronitrile, 2,2'-azobis(2-amidinopropane)dihydrochloride, 2,2'-azobis[2-(5-methyl-2-imidazoline-2-yl)propane]dihydrochloride, 2,2'-azobis(2-methylpropionamidine)disulfate, 2,2'-azobis(N,N'-dimethyleneisobutylamidine), and 2,2'-azobis[N-(2-carboxyethyl)-2-methylpropionamidine]hydrate (VA-057, manufactured by Wako Pure Chemical Industries, Ltd.); persulfates such as potassium persulfate and ammonium persulfate; peroxide initiators such as di(2-ethylhexyl)peroxydicarbonate, di(4-tert-butylcyclohexyl)peroxydicarbonate, di-sec-butylperoxydicarbonate, tert-butylperoxyneodecanoate, tert-hexylperoxypivalate, tert-butylperoxypivalate, dilauroyl peroxide, di-n-octanoyl peroxide, 1,1,3,3-tetramethylbutylperoxy-2-ethyl hexanoate, di(4-methylbenzoyl) peroxide, dibenzoyl peroxide, tert-butylperoxyisobutylate, 1,1-di(tert-hexylperoxy)cyclohexane, tert-butylhydroperoxide, and hydrogen peroxide; and redox system initiators of a combination of a peroxide and a reducing agent, such as a combination of a persulfate and sodium hydrogen sulfite and a combination of a peroxide and sodium ascorbate.

One of the above polymerization initiators may be used alone, or two or more thereof may be used in a mixture. The content of the polymerization initiator is preferably from about 0.005 to 1 part by weight, even more preferably from about 0.02 to about 0.5 parts by weight, based on 100 parts by total weight of the monomer component.

For example, when 2,2'-azobisisobutyronitrile is used as a polymerization initiator for the production of the (meth) acryl-based polymer with the above weight average molecular weight, the polymerization initiator is preferably used in a content of from about 0.06 to about 0.2 parts by weight, more preferably of from about 0.08 to about 0.175 parts by weight, based on 100 parts by total weight of the monomer component.

Examples of the chain transfer agent include lauryl mercaptan, glycidyl mercaptan, mercaptoacetic acid, 2-mercaptoethanol, thioglycolic acid, 2-ethylhexyl thioglycolate and 2,3-dimercapto-1-propanol. One of these chain transfer agents may be used alone, or two or more thereof may be used in a mixture. The total content of the chain transfer agent is preferably about 0.1 parts by weight or less, based on 100 parts by total weight of the monomer component.

Examples of the emulsifier used in emulsion polymerization include anionic emulsifiers such as sodium lauryl sulfate, ammonium lauryl sulfate, sodium dodecylbenzenesulfonate, ammonium polyoxyethylene alkyl ether sulfate, and sodium polyoxyethylene alkyl phenyl ether sulfate; and nonionic emulsifiers such as polyoxyethylene alkyl ether, polyoxyethylene alkyl phenyl ether, polyoxyethylene fatty acid ester, and polyoxyethylene-polyoxypropylene block polymers. These emulsifiers may be used alone, or two or more thereof may be used in combination.

The emulsifier may be a reactive emulsifier. Examples of such an emulsifier having an introduced radical-polymerizable functional group such as a propenyl group and an allyl ether group include Aqualon HS-10, HS-20, KH-10, BC-05, BC-10, and BC-20 (each manufactured by Dai-ichi Kogyo Seiyaku Co., Ltd.) and Adekaria Soap SE10N (manufactured by ADEKA CORPORATION). The reactive emulsifier is preferred, because after polymerization, it can be incorporated into a polymer chain to improve water resistance. Based on 100 parts by total weight of the monomer component, the emulsifier is preferably used in a content of 0.3 to 5 parts by weight, more preferably of 0.5 to 1 part by weight, in view of polymerization stability or mechanical stability.

When the (meth)acryl-based polymer is produced by active energy ray polymerization, the production can be attained by irradiating the monomer component (s) with an active energy ray, such as an electron beam or an ultraviolet ray, to be polymerized. When the active energy ray polymerization is attained using the electron beam, it is not particularly necessary to incorporate a photopolymerization initiator into the monomer component(s). When the active energy ray polymerization is attained through the ultraviolet ray polymerization, a photopolymerization initiator may be incorporated into the monomer component(s) to produce, particularly, an advantage of shortening the polymerization period, and/or some other advantage. The photopolymerization initiator may be used alone or in a mixture of two or more. About the monomer component(s), a part thereof may be beforehand polymerized to be made into a syrup, and in the irradiation with the radial ray, the syrup is usable.

The photopolymerization initiator is not particularly limited as long as it can initiate photopolymerization, and photopolymerization initiators that are usually used can be employed. Examples thereof that can be used include benzoin ether-based photopolymerization initiator, acetophenone-based photopolymerization initiator, α-ketol-based photopolymerization initiator, aromatic sulfonyl chloride-based photopolymerization initiator, photoactive oxime-based photopolymerization initiator, benzoin-based photopolymerization initiator, benzyl-based photopolymerization initiator, benzophenone-based photopolymerization initiator, ketal-based photopolymerization initiator, thioxanthone-based photopolymerization initiator, acylphosphine oxide-based photopolymerization initiator, and the like.

Specific examples of the benzoin ether-based photopolymerization initiator include benzoin methyl ether, benzoin ethyl ether, benzoin propyl ether, benzoin isopropyl ether, benzoin isobutyl ether, 2,2-dimethoxy-1,2-diphenylethan-1-one (trade name: IRGACURE 651, manufactured by BASF), anisoin methyl ether, and the like. Examples of the acetophenone-based photopolymerization initiator include 1-hydroxycyclohexyl phenyl ketone (trade name: IRGACURE 184, manufactured by BASF), 4-phenoxydichloroacetophenone, 4-t-butyl-dichloroacetophenone, 1-[4-(2-hydroxyethoxy)-phenyl]-2-hydroxy-2-methyl-1-propan-1-one (trade name: IRGACURE 2959, manufactured by BASF), 2-hydroxy-2-methyl-1-phenyl-propan-1-one (trade name: DAROCUR 1173, manufactured by BASF), methoxyacetophenone, and the like. Examples of the α-ketol-based photopolymerization initiator include 2-methyl-2-hydroxypropiophenone, 1-[4-(2-hydroxyethyl)-phenyl]-2-hydroxy-2-methylpropan-1-one, and the like. Examples of the aromatic sulfonyl chloride-based photopolymerization initiator include 2-naphthalene sulfonyl chloride and the like. Examples of the photoactive oxime-based photopolymerization initiator include 1-phenyl-1,2-propanedione-2-(O-ethoxycarbonyl)-oxime, and the like.

Examples of the benzoin-based photopolymerization initiator include benzoin and the like. Examples of the benzyl-based photopolymerization initiator include benzyl and the like. Examples of the benzophenone-based photopolymerization initiators include benzophenone, benzoylbenzoic acid, 3,3'-dimethyl-4-methoxybenzophenone, polyvinyl benzophenone, α-hydroxycyclohexyl phenyl ketone, and the like. Examples of the ketal-based photopolymerization initiator include benzyl dimethyl ketal and the like. Examples of the thioxanthone-based photopolymerization initiator include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, isopropylthioxanthone, 2,4-diisopropylthioxanthone, dodecylthioxanthone and the like.

Examples of the acylphosphine oxide-based photopolymerization initiator include bis(2,6-dimethoxybenzoyl)phenylphosphine oxide, bis(2,6-dimethoxybenzoyl)(2,4,4-trimethylpentyl)phosphine oxide, bis(2,6-dimethoxybenzoyl)-n-butylphosphine oxide, bis(2,6-dimethoxybenzoyl)-(2-methylpropan-1-yl)phosphine oxide, bis(2,6-dimethoxybenzoyl)-(1-methylpropan-1-yl)phosphine oxide, bis(2,6-dimethoxybenzoyl)-t-butylphosphine oxide, bis(2,6-dimethoxybenzoyl)cyclohexylphosphine oxide, bis(2,6-dimethoxybenzoyl)octylphosphine oxide, bis(2-methoxybenzoyl) (2-methylpropan-1-yl)phosphine oxide, bis(2-methoxybenzoyl) (1-methylpropan-1-yl)phosphine oxide, bis(2,6-diethoxybenzoyl) (2-methylpropan-1-yl)phosphine oxide, bis(2,6-diethoxybenzoyl) (1-methylpropan-1-yl) phosphine oxide, bis(2,6-dibutoxybenzoyl) (2-methylpropan-1-yl)phosphine oxide, bis(2,4-dimethoxybenzoyl)(2-methylpropan-1-yl)phosphine oxide, bis(2,4,6-trimethylbenzoyl)(2,4-dipentoxyphenyl)phosphine oxide, bis(2,6-dimethoxybenzoyl)benzylphosphine oxide, bis(2,6-dimethoxybenzoyl)-2-phenylpropylphosphine oxide, bis(2,6-dimethoxybenzoyl)-2-phenylethylphosphine oxide, bis(2,6-dimethoxybenzoyl)benzylphosphine oxide, bis(2,6-dimethoxybenzoyl)-2-phenylpropylphosphine oxide, bis(2,6-dimethoxybenzoyl)-2-phenylethylphosphine oxide, 2,6-dimethoxybenzoyl benzylbutylphosphine oxide, 2,6-dimethoxybenzoyl benzyloctylphosphine oxide, bis(2,4,6-trimethylbenzoyl)-2,5-diisopropylphenylphosphine oxide, bis(2,4,6-trimethylbenzoyl)-2-ethylphenylphosphine oxide, bis(2,4,6-trimethylbenzoyl)-4-methylphenylphosphine oxide, bis(2,4,6-trimethylbenzoyl)-2,5-diethylphenylphosphine oxide, bis(2,4,6-trimethylbenzoyl)-2,3,5,6-tetramethylphenylphosphine oxide, bis(2,4,6-trimethylbenzoyl)-2,4-di-n-butoxyphenylphosphine oxide, 2,4,6-trimethylbenzoyl diphenylphosphine oxide, bis(2,6-dimethoxybenzoyl)-2,4,4-trimethylpentylphosphine oxide, bis(2,4,6-trimethylbenzoyl)isobutylphosphine oxide, 2,6-dimethoxybenzoyl-2,4,6-trimethylbenzoyl-n-butylphosphine oxide, bis(2,4,6-trimethylbenzoyl)phenylphosphine oxide, bis(2,4,6-trimethylbenzoyl)-2,4-dibutoxyphenylphosphine oxide, 1,10-bis[bis(2,4,6-trimethylbenzoyl)phosphine oxide]decane, tri(2-methylbenzoyl)phosphine oxide, and the like.

The content of the photopolymerization initiator is not particularly limited, but is preferably 0.01 to 5 parts by weight, more preferably 0.05 to 3 parts by weight, furthermore preferably 0.05 to 1.5 parts by weight, and particularly preferably 0.1 to 1 part by weight, based on 100 parts by total weight of the monomer component.

If the photopolymerization initiator is used in an amount of less than 0.01 parts by weight, the polymerization reaction may be insufficient. If the photopolymerization initiator is used in an amount of more than 5 parts by weight, the photopolymerization initiator may absorb ultraviolet rays, so that ultraviolet rays may fail to reach the inside of the pressure-sensitive adhesive layer. In this case, the degree of polymerization may decrease, or a polymer with a lower molecular weight may be produced. This may cause the resulting pressure-sensitive adhesive layer to have lower cohesive strength, so that in the process of peeling off the pressure-sensitive adhesive layer from a film, the pressure-sensitive adhesive layer may partially remain on the film, which may make it impossible to reuse the film. The photopolymerization initiators may be used singly or in combination of two or more.

In the invention, the (meth)acryl-based polymer preferably has a weight average molecular weight of 400,000 to 2,500,000, more preferably 600,000 to 2,200,000. When the weight average molecular weight is more than 400,000, the pressure-sensitive adhesive layer can have satisfactory durability and can have a cohesive strength small enough to suppress adhesive residue. On the other hand, if the weight average molecular weight is more than 2,500,000, bonding ability or adhesive strength may tend to be lower. In this case, the pressure-sensitive adhesive may form a solution with too high a viscosity, which may be difficult to apply. As used herein, the term "weight average molecular weight" refers to a polystyrene-equivalent weight average molecular weight, which is determined using gel permeation chromatography (GPC). It should be noted that the molecular weight of the (meth)acryl-based polymer obtained by radiation polymerization would be difficult to measure.

<Measurement of Weight Average Molecular Weight>

The weight average molecular weight of the obtained (meth)acryl-based polymer was measured by gel permeation chromatography (GPC) as follows. The polymer sample was dissolved in tetrahydrofuran to form a 0.1% by weight solution. After allowed to stand overnight, the solution was filtered through a 0.45 μm membrane filter, and the filtrate was used for the measurement. Analyzer: HLC-8120GPC manufactured by TOSOH CORPORATION Columns:

(meth)acryl-based polymer: $GM7000H_{XL}+GMH_{XL}+GMH_{XL}$, manufactured by TOSOH CORPORATION, aromatic-based polymer: $G3000HXL+2000HXL+G1000HXL$ manufactured by TOSOH CORPORATION Column size: each 7.8 mmφ×30 cm, 90 cm in total Eluent: tetrahydrofuran (concentration 0.1% by weight)

Flow rate: 0.8 ml/minute

Inlet pressure: 1.6 MPa

Detector: differential refractometer (RI)

Column temperature: 40° C.

Injection volume: 100 μl

Eluent: tetrahydrofuran

Detector: differential refractometer

Standard sample: polystyrene

The pressure-sensitive adhesive used to form the pressure-sensitive adhesive layer A, B of the present invention may contain a crosslinking agent. Examples of the crosslinking agents include an isocyanate crosslinking agent, an epoxy crosslinking agent, a silicone crosslinking agent, an oxazoline crosslinking agent, an aziridine crosslinking agent, a silane crosslinking agent, an alkyl etherified melamine crosslinking agent, a metallic chelate crosslinking agent and a peroxide. Such crosslinking agents may be used alone or in combination of two or more. An isocyanate crosslinking agent or an epoxy crosslinking agent is preferably used as the crosslinking agent.

These crosslinking agents may be used alone or in a mixture of two or more. The total content of the crosslinking agent(s) is preferably 0.01 to 5 parts by weight, more preferably 0.01 to 4 parts by weight, even more preferably 0.02 to 3 parts by weight, based on 100 parts by weight of the (meth)acryl-based polymer.

The term "isocyanate crosslinking agent" refers to a compound having two or more isocyanate groups (which may include functional groups that are temporarily protected with an isocyanate blocking agent or by oligomerization and are convertible to isocyanate groups) per molecule.

Isocyanate crosslinking agents include aromatic isocyanates such as tolylene diisocyanate and xylene diisocyanate, alicyclic isocyanates such as isophorone diisocyanate, and aliphatic isocyanates such as hexamethylene diisocyanate.

More specifically, examples of isocyanate crosslinking agents include lower aliphatic polyisocyanates such as butylene diisocyanate and hexamethylene diisocyanate; alicyclic isocyanates such as cyclopentylene diisocyanate, cyclohexylene diisocyanate, and isophorone diisocyanate; aromatic diisocyanates such as 2,4-tolylene diisocyanate, 4,4'-diphenylmethane diisocyanate, xylylene diisocyanate, and polymethylene polyphenyl isocyanate; isocyanate adducts such as a trimethylolpropane-tolylene diisocyanate trimer adduct (trade name: CORONATE L, manufactured by NIPPON POLYURETHANE INDUSTRY CO., LTD.), a trimethylolpropane-hexamethylene diisocyanate trimer adduct (trade name: CORONATE HL, manufactured by NIPPON POLYURETHANE INDUSTRY CO., LTD.), and an isocyanurate of hexamethylene diisocyanate (trade name: CORONATE HX, manufactured by NIPPON POLYURETHANE INDUSTRY CO., LTD.); a trimethylolpropane adduct of xylylene diisocyanate (trade name: D110N, manufactured by Mitsui Chemicals, Inc.) and a trimethylolpropane adduct of hexamethylene diisocyanate (trade name: D160N, manufactured by Mitsui Chemicals, Inc.); polyether polyisocyanate and polyester polyisocyanate; adducts thereof with various polyols; and polyisocyanates polyfunctionalized with an isocyanurate bond, a biuret bond, an allophanate bond, or the like. In particular, aliphatic isocyanates are preferably used because of their high reaction speed.

These isocyanate crosslinking agents may be used alone or in a mixture of two or more. The total content of the isocyanate crosslinking agent(s) is preferably 0.01 to 5 parts by weight, more preferably 0.01 to 4 parts by weight, further more preferably 0.02 to 3 parts by weight, based on 100 parts by weight of the (meth)acryl-based polymer. The content may be appropriately determined taking into account cohesive strength, the ability to prevent delamination in a durability test, or other properties.

When an aqueous dispersion of a modified (meth)acryl-based polymer produced by emulsion polymerization is used, the isocyanate crosslinking agent does not have to be used. If necessary, however, a blocked isocyanate crosslinking agent may also be used in such a case, because the isocyanate crosslinking agent itself can easily react with water.

The term "epoxy crosslinking agent" refers to a polyfunctional epoxy compound having two or more epoxy groups per molecule. Examples of the epoxy crosslinking agent include bisphenol A, epichlorohydrin-based epoxy resin, ethylene glycol diglycidyl ether, N,N,N',N'-tetraglycidyl-m-xylenediamine, diglycidylaniline, 1,3-bis(N,N-diglycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, glycerine diglycidyl ether, glycerine triglycidyl ether, polyglycerol polyglycidyl ether, sorbitan polyglycidyl ether, trimethylolpropane polyglycidyl ether, diglycidyl adipate, diglycidyl o-phthalate, triglycidyl tris(2-hydroxyethyl) isocyanurate, resorcin diglycidyl ether, bisphenol-S diglycidyl ether, and epoxy resins having two or more epoxy groups in the molecule. The epoxy crosslinking agent may also be a commercially available product such as TETRAD-C (trade name) or TETRAD-X (trade name) manufactured by MITSUBISHI GAS CHEMICAL COMPANY, INC.

These epoxy crosslinking agents may be used alone or in a mixture of two or more. The total content of the epoxy crosslinking agent(s) is preferably 0.01 to 5 parts by weight, more preferably 0.01 to 4 parts by weight, further more preferably 0.02 to 3 parts by weight, based on 100 parts by weight of the (meth)acryl-based polymer. The content may be appropriately determined taking into account cohesive strength, the ability to prevent delamination in a durability test, or other properties.

Any peroxide crosslinking agents capable of generating active radical species by heating and promoting the crosslinking of the base polymer in the pressure-sensitive adhesive may be appropriately used. In view of workability and stability, a peroxide with a one-minute half-life temperature of 80° C. to 160° C. is preferably used, and a peroxide with a one-minute half-life temperature of 90° C. to 140° C. is more preferably used.

Examples of the peroxide for use in the invention include di(2-ethylhexyl) peroxydicarbonate (one-minute half-life temperature: 90.6° C.), di(4-tert-butylcyclohexyl) peroxydicarbonate (one-minute half-life temperature: 92.1° C.), di-sec-butyl peroxydicarbonate (one-minute half-life temperature: 92.4° C.), tert-butyl peroxyneodecanoate (one-minute half-life temperature: 103.5° C.), tert-hexyl peroxypivalate (one-minute half-life temperature: 109.1° C.), tert-butyl peroxypivalate (one-minute half-life temperature: 110.3° C.), dilauroyl peroxide (one-minute half-life temperature: 116.4° C.), di-n-octanoylperoxide (one-minute half-life temperature: 117.4° C.), 1,1,3,3-tetramethylbutylperoxy-2-ethyl hexanoate (one-minute half-life temperature: 124.3° C.), di(4-methylbenzoyl) peroxide (one-minute half-life temperature: 128.2° C.), dibenzoyl peroxide (one-minute half-life temperature: 130.0° C.), tert-butyl peroxyisobutylate (one-minute half-life temperature: 136.1° C.), and 1,1-di(tert-hexylperoxy)cyclohexane (one-minute half-life temperature: 149.2° C.). In particular, di(4-tert-butylcyclohexyl) peroxydicarbonate (one-minute half-life temperature: 92.1° C.), dilauroyl peroxide (one-minute half-life temperature: 116.4° C.), dibenzoyl peroxide (one-minute half-life temperature: 130.0° C.), or the like is preferably used, because they can provide high crosslinking reaction efficiency.

The half life of the peroxide is an indicator of how fast the peroxide can be decomposed and refers to the time required for the amount of the peroxide to reach one half of its original value. The decomposition temperature required for a certain half life and the half life time obtained at a certain temperature are shown in catalogs furnished by manufacturers, such as "Organic Peroxide Catalog, 9th Edition, May, 2003" furnished by NOF CORPORATION.

One of the peroxide crosslinking agents may be used alone, or a mixture of two or more of the peroxide crosslinking agent may be used. The total content of the peroxide(s) is preferably from 0.02 to 2 parts by weight, more preferably from 0.05 to 1 part by weight, based on 100 parts by weight of the (meth)acryl-based polymer. The content of the peroxide (s) may be appropriately selected in this range in order to control the workability, reworkability, crosslink stability or peeling properties.

The amount of decomposition of the peroxide may be determined by measuring the peroxide residue after the reaction process by high performance liquid chromatography (HPLC).

More specifically, for example, after the reaction process, about 0.2 g of each pressure-sensitive adhesive composition is taken out, immersed in 10 ml of ethyl acetate, subjected to shaking extraction at 25° C. and 120 rpm for 3 hours in a shaker, and then allowed to stand at room temperature for 3 days. Thereafter, 10 ml of acetonitrile is added, and the mixture is shaken at 25° C. and 120 rpm for 30 minutes. About 10 µl of the liquid extract obtained by filtration through a membrane filter (0.45 µm) is subjected to HPLC by injection and analyzed so that the amount of the peroxide after the reaction process is determined.

As the crosslinking agent, a polyfunctional metal chelate may also be used in combination with an organic crosslinking agent. Examples of the polyfunctional metal chelate may include a polyvalent metal and an organic compound that is covalently or coordinately bonded to the metal. Examples of the polyvalent metal atom include Al, Cr, Zr, Co, Cu, Fe, Ni, V, Zn, In, Ca, Mg, Mn, Y, Ce, Sr, Ba, Mo, La, Sn, and Ti. The organic compound has a covalent or coordinate bond-forming atom such as an oxygen atom. Examples of the organic compound include alkyl esters, alcohol compounds, carboxylic acid compounds, ether compounds, and ketone compounds.

The pressure-sensitive adhesive that forms each of the pressure-sensitive adhesive layers A and B in the present invention may contain, as the crosslinking agent, a polyfunctional monomer. The polyfunctional monomer is a monomer having at least two polymerizable functional groups with an unsaturated double bond such as (meth)acryloyl group or vinyl group. Examples thereof are the same as given as the monomer component or one of the monomer components for forming the (meth)acryl-based polymer.

The polyfunctional monomers, as the crosslinking agent, may be used alone or in a mixture of two or more. The total content of the crosslinking agent (polyfunctional monomer) is preferably from 0.001 to 5 parts by weight, more preferably from 0.005 to 3 parts by weight, even more preferably from 0.01 to 1 part by weight based on 100 parts by weight of the (meth)acryl-based polymer.

A photopolymerization initiator is blended into the pressure-sensitive adhesive into which the crosslinking agent (polyfunctional monomer) is blended. Examples of the photopolymerization initiator are the same as used to prepare the (meth)acryl-based polymer. The use amount of the photopolymerization initiator is usually from 0.01 to 5 parts by weight, preferably from 0.05 to 3 parts by weight, more preferably from 0.05 to 1.5 parts by weight, even more preferably from 0.1 to 1 part by weight based on 100 parts by weight of the crosslinking agent (polyfunctional monomer). The pressure-sensitive adhesive into which the crosslinking agent (polyfunctional monomer) is blended is irradiated with an active energy ray to be cured so that a pressure-sensitive adhesive layer (active-energy-ray-cured-pressure-sensitive adhesive layer) is formed.

About the multiple pressure-sensitive adhesive layer, which is the pressure-sensitive adhesive layer A, at least one of the pressure-sensitive adhesive layers thereof is preferably an active-energy-ray-cured-pressure-sensitive adhesive layer formed by irradiation with an active energy ray from the viewpoint of the dent-absorbing capability thereof. The first pressure-sensitive adhesive layer (a) and/or the second pressure-sensitive adhesive layer (b) is/are in particular preferably one or two active energy ray cured adhesive layers.

The pressure-sensitive adhesive used to form the pressure-sensitive adhesive layer A, B of the present invention may contain a (meth)acryl-based oligomer in view of improving adhesive strength. The (meth)acryl-based oligomer is preferably a polymer having a Tg higher than that of the (meth)acryl-based polymer according to the invention and having a weight average molecular weight lower than that of the (meth)acryl-based polymer according to the invention. The (meth)acryl-based oligomer functions as a tackifying resin and is advantageous in increasing adhesive strength without raising dielectric constant.

The (meth)acryl-based oligomer may have a Tg of from about 0° C. to about 300° C., preferably from about 20° C. to about 300° C., more preferably from about 40° C. to about 300° C. If the Tg is lower than about 0° C., the pressure-sensitive adhesive layer may be lowered in cohesive strength at room temperature or higher so as to be lowered in holding performance or in tackiness at high temperatures. Like the Tg of the (meth)acryl-based polymer, the Tg of the (meth)acryl-based oligomer is the theoretical value calculated from the Fox equation.

The (meth)acryl-based oligomer may have a weight average molecular weight of 1,000 to less than 30,000, preferably 1,500 to less than 20,000, more preferably 2,000 to less than 10,000. If the oligomer has a weight average molecular weight of 30,000 or more, the effect of improving adhesive strength cannot be sufficiently obtained in some cases. The oligomer with a weight average molecular weight of less than 1,000 may lower the adhesive strength or holding performance because of its relatively low molecular weight. In the invention, the weight average molecular weight of the (meth)acryl-based oligomer can be determined as a polystyrene-equivalent weight average molecular weight by GPC method. More specifically, the weight average molecular weight can be determined using HPLC 8020 with two TSKgel GMH-H (20) columns manufactured by TOSOH CORPORATION under the conditions of a solvent of tetrahydrofuran and a flow rate of about 0.5 ml/minute.

Examples of monomers that may be used to form the (meth)acryl-based oligomer include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, sec-butyl (meth)acrylate, tert-butyl (meth)acrylate, pentyl (meth)acrylate, isopentyl (meth)acrylate, hexyl (meth)acrylate, 2-ethylhexyl (meth)acrylate, heptyl (meth)acrylate, octyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, or dodecyl (meth)acrylate; an ester of (meth)acrylic acid and an alicyclic alcohol, such as cyclohexyl (meth)acrylate, isobornyl (meth)acrylate or dicyclopentanyl (meth)acrylate; aryl (meth)acrylate such as phenyl (meth)acrylate or benzyl (meth)acrylate; and a (meth)acrylate derived from a terpene compound derivative alcohol. These (meth)acrylates may be used alone or in combination of two or more.

The (meth)acryl-based oligomer preferably contains, as a monomer unit, an acrylic monomer having a relatively bulky structure, typified by an alkyl (meth)acrylate whose alkyl group has a branched structure, such as isobutyl (meth)acrylate or tert-butyl (meth)acrylate; an ester of (meth)acrylic acid and an alicyclic alcohol, such as cyclohexyl (meth)acrylate or isobornyl (meth)acrylate; or aryl (meth)acrylate such as phenyl (meth)acrylate or benzyl (meth)acrylate, or any other cyclic structure-containing (meth)acrylate. The use of a (meth)acryl-based oligomer with such a bulky structure can further improve the tackiness of the pressure-sensitive adhesive layer. In terms of bulkiness, cyclic structure-containing oligomers are highly effective, and oligomers having two or more rings are more effective. When ultraviolet light is used in the process of synthesizing the (meth)acryl-based oligomer or forming the pressure-sensitive adhesive layer, a saturated oligomer is preferred because such an oligomer is less likely to inhibit polymerization, and an alkyl (meth)acrylate whose alkyl group has a branched structure or an ester of an alicyclic alcohol and (meth)acrylic acid is preferably used as a monomer to form the (meth)acryl-based oligomer.

From these points of view, preferred examples of the (meth)acryl-based oligomer include a copolymer of cyclohexyl methacrylate (CHMA) and isobutyl methacrylate (IBMA), a copolymer of cyclohexylmethacrylate (CHMA) and isobornylmethacrylate (IBXMA), a copolymer of cyclohexyl methacrylate (CHMA) and acryloyl morpholine (ACMO), a copolymer of cyclohexylmethacrylate (CHMA) and diethylacrylamide (DEAA), a copolymer of 1-adamanthyl acrylate (ADA) and methyl methacrylate (MMA), a copolymer of dicyclopentanyl methacrylate (DCPMA) and isobornyl methacrylate (IBXMA), a copolymer of dicyclopentanyl methacrylate (DCPMA) and methyl methacrylate (MMA), and a homopolymer of each of dicyclopentanyl methacrylate (DCPMA), cyclohexyl methacrylate (CHMA), isobornyl methacrylate (IBXMA), isobornyl acrylate (IBXA), dicyclopentanyl acrylate (DCPA), 1-adamanthyl methacrylate (ADMA), and 1-adamanthyl acrylate (ADA). In particular, an oligomer composed mainly of CHMA is preferred.

In the pressure-sensitive adhesive used to form the pressure-sensitive adhesive layer A, B of the present invention, the content of the (meth)acryl-based oligomer is preferably, but not limited to, 70 parts by weight or less, more preferably from 1 to 70 parts by weight, even more preferably from 2 to 50 parts by weight, still more preferably from 3 to 40 parts by weight, based on 100 parts by weight of the (meth)acryl-based polymer. If the content of the (meth) acryl-based oligomer is more than 70 parts by weight, a problem may occur such as an increase in elastic modulus or a decrease in tackiness at low temperature. Adding 1 part by weight or more of the (meth)acryl-based oligomer is effective in improving adhesive strength.

The pressure-sensitive adhesive used to form the pressure-sensitive adhesive layer A, B of the present invention may further contain a silane coupling agent for improving water resistance at the interface between the pressure-sensitive adhesive layer and a hydrophilic adherend, such as glass, bonded thereto. The content of the silane coupling agent is preferably 1 part by weight or less, more preferably from 0.01 to 1 part by weight, even more preferably from 0.02 to 0.6 parts by weight, based on 100 parts by weight of the (meth)acryl-based polymer. If the content of the silane coupling agent is too high, the adhesive may have a higher adhesive strength to glass so that it may be less removable from glass. If the content of the silane coupling agent is too low, the durability of the adhesive may undesirably decrease.

Examples of silane coupling agent preferably can be used include epoxy group-containing silane coupling agents such as 3-glycidoxypropyltrimethoxysilane, 3-glycidoxypropyltriethoxysilane, 3-glycidoxypropylmethyldiethoxysilane, and 2-(3,4-epoxycyclohexyl)ethyltrimethoxysilane; amino group-containing silane coupling agents such as 3-aminopropyltrimethoxysilane, N-(2-aminoethyl)-3-aminopropylmethyldimethoxysilane, 3-triethoxysilyl-N-(1,3-dimethyl-butylidene)propylamine and N-phenyl-γ-aminopropyltrimethoxysilane; (meth)acrylic group-containing silane coupling agents such as 3-acryloxypropyltrimethoxysilane and 3-methacryloxypropyltriethoxysilane; and isocyanate group-containing silane coupling agents such as 3-isocyanatepropyltriethoxysilane.

The pressure-sensitive adhesive used to form the pressure-sensitive adhesive layer A, B of the present invention may also contain any other known additive. For example, a polyether compound such as a polyalkylen glycol exemplified a polypropylene glycol, a powder such as a colorant and a pigment, a dye, a surfactant, a plasticizer, a tackifier, a surface lubricant, a leveling agent, a softening agent, an antioxidant, an age resister, a light stabilizer, an ultraviolet absorbing agent, a polymerization inhibitor, an inorganic or organic filler, a metal powder, or a particle- or foil-shaped material may be added as appropriate depending on the intended use. A redox system including an added reducing agent may also be used in the controllable range.

For example, the pressure-sensitive adhesive layers A, B may be formed by a method including applying the formation material (pressure-sensitive adhesive) to a member such as a transparent substrate and/or a single-side protected polarizing film, removing the polymerization solvent and so on by drying to form a pressure-sensitive adhesive layers. Before the formation material is applied, appropriately at least one solvent other than the polymerization solvent may be added to the formation material.

Various methods may be used to apply the formation material. Specific examples of such methods include roll coating, kiss roll coating, gravure coating, reverse coating, roll brush coating, spray coating, dip roll coating, bar coating, knife coating, air knife coating, curtain coating, lip coating, and extrusion coating with a die coater or the like.

The heat drying temperature is preferably from 40° C. to 200° C., more preferably from 50° C. to 180° C., in particular, preferably from 70° C. to 170° C. Setting the heating temperature within the above range makes it possible to obtain a pressure-sensitive adhesive layer A or B having good adhesive properties. The drying time may be any appropriate period of time. The drying time is preferably from 5 seconds to 20 minutes, more preferably from 5 seconds to 10 minutes, in particular, preferably from 10 seconds to 5 minutes.

When the formation material (pressure-sensitive adhesive) is an active energy ray curing adhesive, the formation of the pressure-sensitive adhesive layers A and B can be attained by irradiating the material with an active energy ray, such as an ultraviolet ray, to be polymerized. For the ultraviolet irradiation, for example, a high-pressure mercury lamp, a low-pressure mercury lamp, or a metal halide lamp is usable.

The pressure-sensitive adhesive layers A and B may be formed onto a support, and then transferred onto, for example, a single-side protected polarizing film. The support may be, for example, a release-treated sheet. A silicone release liner is preferably used as the release-treated sheet. About the multiple pressure-sensitive adhesive layer, which is the pressure-sensitive adhesive layer A, the first and second pressure-sensitive adhesive layers (a) and (b), and others may be formed successively onto the release-treated sheet, and the resultant may be bonded onto a single-side protected polarizing film. Alternatively, the first and second pressure-sensitive adhesive layers (a) and (b), and others that are separately formed may be successively formed onto a single-side protected polarizing film to position the first pressure-sensitive adhesive layer (a) to give an outermost surface of the resultant.

In the pressure-sensitive adhesive sheet include the layer pressure-sensitive adhesive layer A or B formed on the release-treated sheet, when the pressure-sensitive adhesive layer is exposed, the pressure-sensitive adhesive layer may be protected with the release-treated sheet (a separator) before practical use. The release-treated sheet is peeled off before actual use.

Examples of the material for forming the separator include a plastic film such as a polyethylene, polypropylene, polyethylene terephthalate, or polyester film, a porous material such as paper, cloth and nonwoven fabric, and an appropriate thin material such as a net, a foamed sheet, a metal foil, and a laminate thereof. In particular, a plastic film is preferably used, because of its good surface smoothness.

The plastic film may be any film capable of protecting the pressure-sensitive adhesive layer A or B, and examples thereof include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, and an ethylene-vinyl acetate copolymer film.

In each of the separators, as its substrate film, a plastic film as described above is used. The film may be optionally subjected to a releasing or antifouling treatment with a silicone-based, fluorine-containing-based, long-chain alkyl-based or fatty acid amide-based release agent, or silica powder, or an antistatic treatment of, for example, a applying, kneading/incorporating or vapor deposition type. The separator can be made higher in peelability from the pressure-sensitive adhesive layer A or B by subjecting the surface of the separator, particularly, to a peeling treatment such as silicone treatment, long-chain alkyl treatment or fluorine treatment.

The silicone-based release layer may be made of, for example, an addition reaction-based silicone resin. Examples thereof include products KS-774, KS-775, KS-778, KS-779H, KS-847H, and KS-847T manufactured by Shin-Etsu Chemical Co., Ltd.; TPR-6700, TPR-6710, and TPR-6721 manufactured by Toshiba silicones Co., Ltd.; and SD 7220 and SD 7226 manufactured by Dow Corning Toray Co., Ltd. The paint amount of the silicon release layer (after the layer is dried) is preferably from 0.01 to 2 $g/m^2$, more preferably from 0.01 to 1 $g/m^2$, even more preferably from 0.01 to 0.5 g/m.

The release layer may be formed by applying a material as described above onto an oligomer prevention layer in a conventional applying manner such as reverse gravure coating, bar coating or die coating, and then treating the resultant thermally at a temperature ranging usually from about 120 to 200° C., thereby curing the material. The thermal treatment may be optionally used together with an active-energy-ray radiation such as ultraviolet-ray radiation.

The thickness of each of the separators (which includes the release layer) is usually from about 5 to 200 μm. The thickness of the separator is related to the peel strength thereof. Thus, it is preferred to adopt, as the thickness, a thickness corresponding to the separator. The thickness of each of the separator SA is preferably 40 μm or more, more preferably 50 μm or more from the viewpoint of the peel strength and the prevention of dents in the separator. Detailedly, the thickness of the separator SA, SB is preferably from 40 to 130 μm, more preferably from 50 to 80 μm. The thickness of the separator SB is preferably from 10 to 80 μm, more preferably from 20 to 50 μm, even more preferably from 30 to 50 μm, even more preferably from 30 to 40 μm. In the structure of the double-sided pressure-sensitive adhesive-layer-attached polarizing film, it is particularly preferred about the thickness of the separators, from the viewpoint of the peel strength and the prevention of the dents, to combine a case where the thickness of the separator SA is 50 μm or more with a case where that of the separator SB is from 30 to 50 μm.

When the pressure-sensitive adhesive layers A and B are located onto the single-side protected polarizing film, a transparent protective film of the polarizing film may be subjected to adhesion-facilitating treatment. Examples of the adhesion-facilitating treatment include corona treatment, plasma treatment, excimer treatment, and hard coat treatment. One or each of the two surfaces of any one of the pressure-sensitive adhesive layers may be subjected to adhesion-facilitating treatment. In the double-sided pressure-sensitive-adhesive-layer-attached polarizing film of the present invention, the surface of its single-side protected polarizing film onto which the pressure-sensitive adhesive layer A is to be laminated is preferably subjected to adhesion-facilitating treatment from the viewpoint of a restraint of the generation of foam and peeling.

The double-sided pressure-sensitive-adhesive-layer-attached polarizing film of the present invention may be prepared to have, at any moiety thereof, an antistatic function. The antistatic function can be given to the double-sided pressure-sensitive-adhesive-layer-attached polarizing film, for example, by incorporating, into its polarizing film or pressure-sensitive adhesive layer(s), an antistatic agent, or by laying an antistatic layer separately from its polarizing film or pressure-sensitive adhesive layers. The formation of the antistatic layer may be according to, for example, a method of using a composition containing a conductive polymer, such as polythiophene, and a binder to form the antistatic layer between the single-side protected polarizing film and any one or each of the pressure-sensitive adhesive layer(s).

The pressure-sensitive adhesive layer A of the double-sided pressure-sensitive-adhesive-layer-attached polarizing film of the present invention is arranged in an image display device (for example, a liquid crystal display device), and at a viewer-side thereof and outside (viewer-side) the polarizing film which is provided nearest to a viewer-side of an image display device among at least one polarizing film used in the device. Accordingly, for example, the following problem of a fall in optical properties of the device can be largely overcome: a problem that the cancelling of light polarization, or impurity-based bright spots that may be generated when an antistatic layer (low-surface-resistance layer) between the viewer-side polarizing film and a panel of the liquid crystal. Thus, the reliability of the polarizing film arranged at the viewer-side and at the outermost position of the device is not damaged. In such a way, the invention makes it possible to give an antistatic function to an image display device without damaging performance thereof.

In the case of applying a technique of laying an antistatic layer onto a polarizing plate to an in-cell type or on-cell type touch-sensor-built-in liquid crystal display device, the technique is particularly effective for preventing image noises based on static electricity. Thus, the present invention makes it possible to heighten the quality of any in-cell type or on-cell type touch-sensor-built-in liquid crystal display device.

In order to give antistatic function to the pressure-sensitive adhesive that forms the pressure-sensitive adhesive layers A and B in the present invention, an ionic compound as an antistatic agent is incorporated, together with the base polymer, into the adhesive. The ionic compound is preferably an alkali metal salt and/or an organic-cation/anion salt. The alkali metal salt may be an organic salt or inorganic salt of an alkali metal. The "organic-cation/anion salt" referred to in the present invention denotes an organic salt in which a cation moiety is made of an organic substance and an anion moiety is made of an organic or inorganic substance. The "organic-cation/anion salt" may be referred to as an ionic liquid or ionic solid.

The ionic compound may be an inorganic salt, such as ammonium chloride, aluminum chloride, copper chloride, ferrous chloride, ferric chloride, or ammonium sulfate, besides the alkali metal salt or organic-cation/anion salt. These ionic compounds may be singly used, or may be used in combination of two or more thereof.

The amount of the ionic compound in the pressure-sensitive adhesive for forming each of the pressure-sensitive adhesive layers A and B in the present invention is preferably from 0.0001 to 5 parts by weight based on 100 parts by weight of the (meth)acryl-based polymer. If the amount of the ionic compound is less than 0.0001 part by weight, the layer may not have a sufficient antistatic effect. The amount of the ionic compound is preferably 0.01 part by weight or more, more preferably 0.1 part by weight or more. In the meantime, if the amount of the ionic compound is more than 5 parts by weight, the layer may not have a sufficient durability. The amount of the ionic compound is preferably 3 parts by weight or less, more preferably 1 part by weight or less. The content of the ionic compound can be set into a preferred range by adopting the upper limit or lower limit value.

In the double-sided pressure-sensitive adhesive-layer-attached polarizing film of the present invention, an ultraviolet absorbent may be incorporated into at least one member located nearer to the viewer-side surface of the film than the location of the polarizer of the single-side protected polarizing film. Examples of the member nearer to the viewer-side surface include the pressure-sensitive adhesive layer A, the separator SA, and the above-mentioned transparent protective film. The incorporation of the ultraviolet absorbent into the member is effective, particularly, for a case where the pressure-sensitive adhesive layer A is made of an ultraviolet-ray curing acrylic adhesive composition. Also in the case of forming a pressure-sensitive adhesive layer having an ultraviolet absorbing function by polymerization based on ultraviolet-ray radiation, the use of this pressure-sensitive adhesive layer in an image display device makes it possible to restrain its optical member, a typical example thereof being its liquid panel, organic EL element or polarizer, from being deteriorated by the matter that the layer gains the ultraviolet absorbing function.

The ultraviolet absorbent is not particularly limited. Examples thereof include triazine-based, benzotriazole-based, benzophenone-based, oxybenzophenone-based, salicylic acid ester-based, and cyanoacrylate-based ultraviolet absorbents. Out of these absorbents, one may be independently used or two or more may be used in combination. Out of these absorbents, preferred are triazine-based, and benzotriazole-based ultraviolet absorbents; and particularly preferred is one or more ultraviolet absorbents selected from the group consisting of triazine-based ultraviolet absorbents each having, in a single molecule thereof, not more than two hydroxyl groups and benzotriazole-based ultraviolet absorbents each having, in a single molecule thereof, one benzotriazole skeleton because the absorbent(s) is/are good in solubility in a monomer used for forming the ultraviolet-ray curing acrylic adhesive composition, and is/are further high in ultraviolet-ray absorbing power at wavelengths of 380 mm and thereabouts.

Specific examples of the triazine-based ultraviolet absorbents each having, in a single molecule thereof, not more than two hydroxyl groups include 2,4-bis-[{4-(4-ethylhexyloxy)-4-hydroxy}-phenyl]-6-(4-methoxyphenyl)-1,3,5-triazine (Tinosorb S, manufactured by BASF), 2,4-bis[2-hydroxy-4-butoxyphenyl]-6-(2,4-dibutoxyphenyl)-1,3,5-triazine (TINUVIN 460, manufactured by BASF), a reaction product (TINUVIN 400, manufactured by BASF) made from 2-(4,6-bis(2,4-dimethylphenyl)-1,3,5-triazine-2-yl)-5-hydroxyphenyl and [(C10-C16 (mainly C12-C13)alkyloxy) methyl]oxirane, 2-[4,6-bis(2,4-dimethylphenyl)-1,3,5-triazine-2-yl]-5-[3-(dodecyloxy)-2-hydroxypropoxy]phenol), a reaction product (TINUVIN 405, manufactured by BASF) made from 2-(2,4-dihydroxyphenyl)-4,6-bis-(2,4-dimethylphenyl)-1,3,5-triazine and an ester of (2-ethylhexyl)-glycidic acid, 2-(4,6-diphenyl-1,3,5-triazine-2-yl)-5-[(hexyl)oxy]-phenol (TINUVIN 1577, manufactured by BASF), 2-(4,6-diphenyl-1,3,5-triazine-2-yl)-5-[2-(2-ethylhexanoyloxy)ethoxy]-phenol (ADK STAB LA46, manufactured by Adeka Corp.), and 2-(2-hydroxy-4-[1-octyloxycarbonylethoxy]phenyl)-4,6-bis(4-phenylphenyl)-1,3,5-triazine (TINUVIN 479, manufactured by BASF).

Examples of the benzotriazole-based ultraviolet absorbents each having, in a single molecule thereof, one benzotriazole skeleton include 2-(2H-benzotriazole-2-yl)-6-(1-methyl-1-phenylethyl)-4-(1,1,3,3-tetramethylbutyl)phenol (TINUVIN 928, manufactured by BASF), 2-(2-hydroxy-5-tert-butylphenyl)-2H-benzotriazole (TINUVIN PS, manufactured by BASF), an esterified product (TINUVIN 384-2, manufactured by BASF) made from benzenepropanoic acid and 3-(2H-benzotrizole-2-yl)-5-(1,1-dimethylethyl)-4-hydroxy(C7-C9 side chain and linear alkyls), 2-(2H-benzotriazole-2-yl)-4,6-bis(1-methyl-1-phenylethyl)phenol (TINUVIN 900, manufactured by BASF), 2-(2H-benzotrizole-2-yl)-6-(1-methyl-1-phenylethyl)-4-(1,1,3,3-t etramethylbutyl)phenol (TINUVIN 928, manufactured by BASF), a reaction product (TINUVIN 1130, manufactured by BASF) made from methyl-3-(3-(2H-benzotriazole-2-yl)-5-t-butyl-4-hydroxyphenyl) propionate and polyethylene glycol 300, 2-(2H-benzotriazole-2-yl)-p-cresol (TINUVIN P, manufactured by BASF), 2-(2H-benzotrizole-2-yl)-4,6-bis(1-methyl-1-phenylethyl) phenol (TINUVIN 234, manufactured by BASF), 2-[5-chloro(2H)-benzotriazole-2-yl]-4-methyl-6-(tert-butyl)phenol (TINUVIN 326, manufactured by BASF), 2-(2H-benzotriazole-2-yl)-4,6-di-tert-pentylphenol (TINUVIN 328, manufactured by BASF), 2-(2H-benzotriazole-2-yl)-4-(1,1,3,3-tetrametylbutyl)phenol (TINUVIN 329, manufactured by BASF), a reaction product (TINUVIN 213, manufactured by BASF) made from methyl 3-(3-(2H-benzotriazole-2-yl)-5-tert-butyl-4-hydroxyphenyl) propionate and polyethylene glycol 300, 2-(2H-benzotriazole-2-yl)-6-dodecyl-4-methylphenol (TINUVIN 571, manufactured by BASF), and 2-[2-hydroxy-3-(3,4,5,6-tetrahydrophthalimide-methyl)-5-methylphenyl] benzotriazole (Sumisorb 250, manufactured by Sumitomo Chemical Co., Ltd.).

Examples of the benzophenone-based ultraviolet absorbents (benzophenone-based compounds) and the oxybenzophenone-based ultraviolet absorbents (oxybenzophenone-based compounds) include 2,4-dihydroxybenzophenone, 2-hydroxy-4-methoxybenzophenone, 2-hydroxy-4-methoxybenzophenone-5-sulfonic acid (anhydride and trihydride), 2-hydroxy-4-octyloxybenzophenone, 4-dodecyloxy-2-hydroxybenzophenone, 4-benzyloxy-2-hydroxybenzophenone, 2,2',4,4'-tetrahydroxybenzophenone, and 2,2'-dihydroxy-4,4'-dimethoxybenzophenone.

Examples of the salicylic acid ester-based ultraviolet absorbents (salicylic acid ester-based compounds) include phenyl-2-acryloyloxybenzoate, phenyl-2-acryloyloxy-3-methylbenzoate, phenyl-2-acryloyloxy-4-methylbenzoate, phenyl-2-acryloyloxy-5-methylbenzoate, phenyl-2-acryloyloxy-3-methoxybenzoate, phenyl-2-hydroxybenzoate, phenyl-2-hydroxy-3-methylbenzoate, phenyl-2-hydroxy-methylbenzoate, phenyl-2-hydroxy-5-methylbenzoate, phenyl 2-hydroxy-3-methoxybenzoate, and 2,4-di-tert-butylphenyl-3,5-di-tert-butyl-4-hydroxybenzoate (TINUVINE 120, manufactured by BASF).

Examples of the cyanoacrylate-based ultraviolet absorbents (cyanoacrylate-based compounds) include alkyl-2-cyanoacrylates, cycloalkyl-2-cyanoacrylates, alkoxyalkyl-2-cyanoacrylates, alkenyl-2-cyanoacrylates, and alkynyl-2-cyanoacrylates.

Preferred is an embodiment in which the ultraviolet absorbent is included in the pressure-sensitive adhesive layer A. Ultraviolet absorbents as described above may be singly used, or may be used in the form of a mixture of two or more thereof. The total amount of the ultraviolet absorbent(s) is, for example, preferably from about 0.1 to 5 parts by weight, more preferably from about 0.5 to 3 parts by weight for 100 parts by weight of one or more monofunctional monomer components from which the (meth)acrylic polymer is made. When the addition amount of the ultraviolet absorbent(s) is set into any one of the ranges, the absorbent can favorably exhibit an ultraviolet-absorbing function of the pressure-sensitive adhesive layer sufficiently, and further does not hinder ultraviolet ray polymerization.

EXAMPLES

Hereinafter, the present invention will be specifically described by way of working examples thereof. However, the invention is not limited by the examples. In each of the examples, the wording "part (s)" and the symbol "%" represent part(s) by weight and % by weight, respectively. The following estimations were made on each of the items in Examples and so on.

<Production of Each Polarizer (a-1): Thickness of 5 μm>

In order to produce each thin polarizing membrane, a laminated body in which a polyvinyl alcohol (PVA) layer of 9 μm thickness was formed on an amorphous polyethylene terephthalate (PET) substrate was initially subjected to in-air auxiliary stretching at a stretching temperature of 130° C. to produce a stretched laminated body. Next, the stretched laminated body was dyed to produce a colored laminated body. The colored laminated body was further subjected to stretching into a total stretch ratio of 5.94 in an aqueous boric acid solution at a stretching temperature of 65° C. to produce each optical film laminated body which included a PVA layer having a thickness of 4 μm and stretched to be integrated with the amorphous PET substrate. By the two-stage stretching, each optical laminated body was produced which had a PVA layer having a thickness of 5 μm and constituting a highly functional polarizing membrane in which the PVA molecules of the PVA layer formed on the amorphous PET substrate were highly oriented and iodine adsorbed by the dyeing was highly oriented, as a polyiodine ion complex, into one direction.

<Production of Each Polarizer (a-2): Thickness of 12 μm>

While a polyvinyl alcohol film of 30 μm thickness in which the average polymerization degree was 2400 and the saponification degree was 99.9% by mole was immersed in hot water of 30° C. temperature to be swollen, the PVA resin film was uniaxially stretched to give a PVA resin film length 2.0 times the original length. Next, the film was immersed in an iodine solution having a concentration of 0.3% by weight (ratio by weight of iodine/potassium iodide=0.5/8) and having a temperature of 30° C., and then dyed while uniaxially stretched to give a PVA resin film length 3.0 times the original length. Thereafter, the PVA resin film was stretched in an aqueous solution of 4% by weight of boric acid and 5% by weight of potassium iodide to give a PVA resin film length 6 times the original length. Furthermore, the film was subjected to iodine-ion-impregnating treatment with an aqueous solution of 3% by weight of potassium iodide (iodine-impregnating bath), and then dried in an oven of 60° C. for 4 minutes to yield each polarizer of 12 μm thickness.

<Transparent Protective Films>

Film b-1: Each (meth)acrylic resin film having a lactone ring structure and having a thickness of 20 μm was subjected to corona treatment, and the resultant was used.

Film b-2: Each cyclic polyolefin film having a thickness of 13 μm (ZEONOR, manufactured by Zeon Corp.) was subjected to corona treatment, and the resultant was used.

<Production of Each Single-Side Protected Polarizing Film>

While a polyvinyl alcohol based adhesive was applied onto an outer surface of the polarizing membrane (thickness: 5 μm) of the optical film laminated body according to the polarizer (a-1) to give an adhesive layer thickness of 0.1 μm, a transparent protective film shown in Table 2 was bonded thereto. The resultant was then dried at 50° C. for 5 minute. Next, the amorphous PET substrate was peeled off therefrom to produce each single-side protected polarizing film using the thin polarizing membrane.

In Example 8, however, a wire bar coater was used to apply a polyvinyl alcohol-based forming material adjusted to a temperature of 25° C. onto the polarizing membrane (polarizer) of one of the above-mentioned single-side protected polarizing films, so as to give a thickness of 2 μm after the forming material was dried. Thereafter, the resultant was dried with hot wind at 60° C. for 1 minute to produce a functional-layer-attached single-side protected polarizing film, and then this film was used.

<Production of Single-Side Protected Polarizing Film>

In the case of using any one of the above-mentioned polarizers (a-2: thickness of 12 μm) instead of the polarizing membrane (thickness: 5 μm) of any one of the above-mentioned optical film laminated bodies, a transparent protective film shown in Table 2 was bonded thereto while the polyvinyl alcohol-based adhesive was applied onto a single surface of the polarizer to give an adhesive layer thickness of 0.1 m. Thereafter, the resultant was dried at 50° C. for 5 minutes to produce each single-side protected polarizing film.

<Production of Pressure-Sensitive Adhesive Layers A>

Pressure-sensitive adhesive layers A were each prepared in accordance with a description in Table 1 as described below.

Production Example 1 (A-1)

<Preparation of Prepolymer>

Into a separable flask equipped with a thermostat, a stirrer, a reflux condenser and a nitrogen gas introducing pipe were incorporated 40 parts of 2-ethylhexyl acrylate (2EHA), 40 parts of isostearyl acrylate, 18 parts of N-vinyl-2-pyrrolidone (NVP), and 2 parts of 4-hydroxybutyl acrylate (4HBA) as monomer components, and 0.2 parts of a photopolymerization initiator (trade name: "IRGACURE 184", manufactured by BASF). The resultant was then irradiated with ultraviolet rays until the viscosity thereof (measuring conditions: a BH viscometer No. rotor; 10 rpm; and measuring temperature: 30° C.) turned to about 20 Pa·s. In this way, a prepolymer composition was yielded in which the monomer components were partially polymerized.

<Preparation of Acrylic Adhesive>

Next, to 100 parts of the prepolymer composition were added 0.2 parts of hexanediol diacrylate (HDDA) as a polyfunctional monomer, and 0.3 parts of a silane coupling agent (trade name: "KBM-403", manufactured by Shin-Etsu Chemical Co., Ltd.), and these components were mixed with each other to yield an ultraviolet-ray curing acrylic adhesive.

Production Examples 2, 3 and 5 (A-2, A-3, and A-5)

In each of the examples, a prepolymer was prepared and then an ultraviolet-ray curing acrylic adhesive was yielded in the same way as in Production Example 1 except that one or more of the following were changed as shown in Table 1: the monomer component and the use amount of the photopolymerization initiator in the item <Preparation of Prepolymer> and the polyfunctional monomer species and the use amount thereof in the item <Preparation of Acrylic Adhesive>. In Production Example 3, at the time of preparing the ultraviolet-ray curing acrylic adhesive, one part of the product Tinosorb S was blended into the adhesive-preparing system.

<Formation of Pressure-Sensitive Adhesive Layers A>

Each of the ultraviolet-ray curing acrylic adhesives (A-1, 2, 3 and 5) yielded, respectively, in Production Examples 1 to 3 and 5 was applied onto a polyester film (peeling liner) having a thickness of 50 μm and having one surface subjected to peeling treatment with silicone to form a applied layer (pressure-sensitive adhesive layer) having a thickness shown in Table 2. Next, a polyester film (peeling liner) having a thickness of 75 μm and having one surface subjected to peeling treatment with silicone was applied to the outer surface of the applied pressure-sensitive adhesive layer to position the peeling-treated surface of this film onto the applied layer side (onto the pressure-sensitive adhesive layer) of the workpiece. In this way, the applied layer of the monomer components was shut out from oxygen. The thus yielded sheet having the applied layer was irradiated, from above the plane of the polyester film of 50 μm thickness, with ultraviolet rays from a black light, the position of the light being adjusted to give an irradiation intensity of 5 mW/cm$^2$ on the light-radiated surface of the film just below the lamp, until the light integral value became 3000 mJ/cm. Thus, the applied layer was cured (first curing) to form a pressure-sensitive adhesive layer A. In this way, each pressure-sensitive adhesive sheet was produced which had the peeling liners, respectively, on both of the pressure-sensitive adhesive layer A.

Production Example 4 (A-4)

<Preparation of Acrylic Polymer>

Into a four-necked flask equipped with stirring fans, a thermostat, a nitrogen gas introducing pipe and a condenser were incorporated 70 parts of 2-ethylhexyl acrylate (2EHA), 15 parts of N-vinyl-2-pyrrolidone (NVP), and 15 parts of 2-hydroxyethyl acrylate (2HEA), and 0.3 parts of 2,2'-azoisobutyronitrile (AIBN) as a thermopolymerization initiator together with 150 parts of ethyl acetate. The reaction system was stirred at 23° C. under a nitrogen atmosphere for 1 hour. Thereafter, the reactive components were caused to react with each other at 58° C. for 4 hours, and subsequently caused to react with each other at 70° C. for 2 hours to prepare an acrylic polymer solution.

Next, the following were added to 100 parts of a polymer solid in the acrylic polymer solution: 0.2 parts of trimethylolpropane triacrylate as a polyfunctional monomer; 0.2 parts of a photopolymerization initiator (trade name: IRGACURE 184, manufactured by BASF); 0.3 parts of 3-glycidoxypropyltrimethoxysilane (trade name: KBM 403, manufactured by Shin-Etsu Chemical Co., Ltd.); and 0.4 parts of a trimethylolpropane adduct (trade name: TAKENATE D110N, manufactured by Mitsui Chemicals, Inc.) of xylylene diisocyanate as a crosslinking agent. These components were mixed with each other into a uniform form to prepare an ultraviolet-ray curing acrylic adhesive.

Production Example 6 (A-6)

In the same way as in Production Example 4 except that the use amount of the crosslinking agent in the item <Preparation of Acrylic Adhesive> in Production Example 4 was changed as shown in Table 1, an acrylic polymer was prepared and an ultraviolet-ray curing acrylic adhesive was yielded.

<Formation of Pressure-Sensitive Adhesive Layers A>

A solution of each of the ultraviolet-ray curing acrylic adhesives (A-4 and 6) yielded, respectively, in Production Examples 4 and 6 was applied to a polyester film (peeling liner) having a thickness of 50 μm and having one surface subjected to peeling treatment with silicone, so as to position the solution onto the peeling-treated surface of the film. The resultant was heated (first curing) at 100° C. for 3 minutes to form a pressure-sensitive adhesive layer having a thickness shown in Table 2. Next, a polyester film (peeling liner) having a thickness of 75 μm and having one surface subjected to peeling treatment with silicone was bonded to the outer surface of the applied pressure-sensitive adhesive layer, so as to position the peeling-treated surface of this film onto the applied layer side of the workpiece. In this way, each pressure-sensitive adhesive sheet was produced which had the peeling liners, respectively, on both of the pressure-sensitive adhesive layer A.

TABLE 1

| | Prepolymer or acrylic polymer preparation | | | | | Acrylic pressure-sensitive adhesive composition | | | | | | |
|---|---|---|---|---|---|---|---|---|---|---|---|---|
| | Monomer components | | Initiator | | | Prepolymer | Initiator | | Polyfunctional monomer | | | |
| | Composition | Use amounts (parts) | Species | Use amounts (parts) | UV radiation | or acrylic polymer (parts) | Species | Use amounts (parts) | Species | Use amounts (parts) | Crosslinking agent Species |
| Production Example 1: A-1 | 2EHA/I STA/NVP/2HBA | 40/40/18/2 | IRGACURE 184 | 0.2 | Done | 100 | | | HDDA | 0.2 | |

TABLE 1-continued

| | | | | | | | | | | | | |
|---|---|---|---|---|---|---|---|---|---|---|---|---|
| Production Example 2: A-2 | 2EHA/NVP/ 2HEA | 70/15/15 | IRGACURE 184 | 0.1 | Done | 100 | | | HDDA | 0.2 | | |
| Production Example 3: A-3 | 2EHA/NVP/ 2HEA | 70/15/15 | IRGACURE 184 | 0.1 | Done | 100 | | | TMPTA | 0.2 | | |
| Production Example 4: A-4 | 2EHA/NVP/ 2HEA | 70/15/15 | AIBN | 0.3 | Not done | 100 | IRGACURE 184 | 0.2 | TMPTA | 0.2 | TAKENATE D110N | |
| Production Example 5: A-5 | 2EHA/NVP/ 2HEA | 70/15/15 | IRGACURE 184 | 0.05 | Done | 100 | | | HDDA | 0.2 | | |
| Production Example 6: A-6 | 2EHA/NVP/ 2HEA | 70/15/15 | AIBN | 0.3 | Not done | 100 | IRGACURE 184 | 0.2 | TMPTA | 0.2 | TAKENATE D110N | |

| | Acrylic pressure-sensitive adhesive composition | | | | | | Pressure-sensitive adhesive layer A | | | | |
|---|---|---|---|---|---|---|---|---|---|---|---|
| | | | | | | | After first curing | | | Change in storage modulus (MPa) at 50° C. according to second curing (formation of pressure-sensitive adhesive layer A') | |
| | Crosslinking agent | Silane coupling agent | | UV absorbent | | | | Peel Strength | | | |
| | Use amounts (parts) | Species | Use amounts (parts) | Species | Use amounts (parts) | Curing means | Storage modulus (MPa) at 25° C. | (N/50-mm) of separator SA | Curing means | Storage modulus before UV radiation | Storage modulus after UV radiation |
| Production Example 1: A-1 | | KBM403 | 0.3 | | | UV | 0.11 | 0.15 | | | |
| Production Example 2: A-2 | | KBM403 | 0.3 | | | UV | 0.15 | 0.2 | | | |
| Production Example 3: A-3 | | KBM403 | 0.3 | Tinosorb S | 1 | UV | 0.14 | 0.2 | | | |
| Production Example 4: A-4 | 0.4 | KBM403 | 0.3 | | | Heating | 0.07 | 0.3 | UV | 0.03 | 0.04 |
| Production Example 5: A-5 | | KBM403 | 0.3 | | | UV | 0.15 | 0.1 | | | |
| Production Example 6: A-6 | 0.2 | KBM403 | 0.3 | | | Heating | 0.05 | 0.3 | UV | 0.02 | 0.03 |

In Table 1,
2EHA represents 2-ethylhexyl acrylate;
ISTA, isostearyl acrylate;
NVP, N-vinyl-2-pyrrolidone:
2HBA, 2-hydroxybutyl acrylate;
HDAA, hexanediol diacrylate;
TMPTA, trimethylolpropane triacrylate;
KBM-403, a silane coupling agent (trade name "KBM-403", manufactured by Shin-Etsu Chemical Co., Ltd.);
TAKENATE D110N, trimethylolpropanexylylene diisocyanate ("TAKENATE D110N", manufactured by Mitsui Chemicals, Inc.);
IRGACURE 184, a photopolymerization initiator (trade name: "IRGACURE 184", manufactured by BASF);
AIBN, 2,2'-azoisobutyronitrile; and
Tinosorb S, 2,4-bis-[{4-(4-ethylhexyloxy)-4-hydroxy}-phenyl]-6-(4-methoxyphenyl)-1,3,5-triazine (manufactured by BASF).

<Production of Pressure-Sensitive Adhesive Layer B>

Into a separable flask equipped with a thermometer, a stirrer, a reflux condenser and a nitrogen gas introducing pipe were charged 99 parts of butyl acrylate (BA), and 1 part of 4-hydroxybutyl acrylate (4HBA) as monomer components, 0.2 part of azoisobutyronitrile as a polymerization initiator, and ethyl acetate as a polymerizing solvent, the volume of which was a volume for setting the solid concentration in the solution into 20%. Thereafter, nitrogen gas was caused to flow into the pipe, and then the flask was purged with nitrogen for about 1 hour while the solution was stirred. The flask was then heated to 60° C. to cause the components to react with each other for 7 hours to yield an acryl-based polymer having a weight average molecular weight (Mw) of 1100000. To the acryl-based polymer solution (solid content: 100 parts) were added 0.8 part of trimethylolpropanetolylene diisocyanate ("CORONATE L", manufactured by Nippon Polyurethane Industry Co., Ltd.) as an isocyanate crosslinking agent, and 0.1 part of a silane coupling agent ("KBM-403", manufactured by Shin-Etsu Chemical Co., Ltd.) to prepare a pressure-sensitive adhesive cormposition (solution). The prepared pressure-sensitive adhesive solution was applied onto polyethylene terephthalate release liners each having a thickness of 38 μm or 50 μm to give each thicknesses of 20 μm, after the resultants would be dried. The resultants were thermally dried at 60° C. for 1 minute and at 150° C. for 1 minute under an ambient pressure to produce pressure-sensitive adhesive layers.

These pressure-sensitive adhesive layers would be used as a pressure-sensitive adhesive layer B.

Example 1

<Production of Each Double-Sided Pressure-Sensitive Adhesive-Layer-Attached Polarizing Film>

The pressure-sensitive adhesive layer B was transferred onto one of the two sides (onto the polarizer side) of a single-side protected polarizing film (size: 150 mm in length×70 mm in width) produced to have a structure shown in Table 2. The peeling liner of 38 μm thickness was left as a separator.

In the meantime, the pressure-sensitive adhesive layer (A-1) of 25 μm thickness was transferred onto the other surface (on the transparent protective film side) of the single-side protected polarizing film, as shown in Table 2. At the time of transferring the pressure-sensitive adhesive layer (A-1), one (thickness: 50 μm) of the two peeling liners of the pressure-sensitive adhesive sheet was peeled off. The other peeling liner (thickness: 75 μm) was left as a separator.

At the time of transferring the pressure-sensitive adhesive layer A, a control was made to set, into 50 μm, the distance (dented quantity) from the single-side protected polarizing film to a site of the pressure-sensitive adhesive layer A that was an innermost depressed site from the film in the manner of making the pressure-sensitive adhesive layer A into the state of being protruded out from the edge of the single-side protected polarizing film by pressuring, and then cutting the protruded moiety to be worked.

Examples 2 to 17 and Comparative Examples 1 to 3

In each of these examples, each double-sided pressure-sensitive adhesive-layer-attached polarizing film was produced in the same way as in Example 1 except that one or more of the following in Example 1 were changed as shown in Table 2: the species of the single-side protected polarizing film; the species or thickness of the pressure-sensitive adhesive layer A; the distance X; the thickness of the separator SA of the pressure-sensitive adhesive layer A; the presence or absence of an adhesion-facilitating layer formed on the pressure-sensitive-adhesive-layer-A-formed surface of the single-side protected polarizing film; the species of the adhesion-facilitating layer; and the thickness of the separator SB of the pressure-sensitive adhesive layer B. In Example 14, the transparent-protecting-film surface of the single-side protected polarizing film was subjected to corona treatment, and subsequently the pressure-sensitive adhesive layer A was transferred.

Evaluations described below were made about the above-mentioned pressure-sensitive adhesive layers A and the pressure-sensitive adhesive layer B, and the double-sided pressure-sensitive adhesive-layer-attached polarizing films (measuring-samples thereof, to each of which the separators (peeling liners) were attached)), which were produced in Production Examples, Examples and Comparative Examples described above. The evaluated results are shown in Table 1 or 2.

<Measurement of Shearing Storage Modulus>

The shearing storage modulus, at 23° C., of any one of the measuring-samples of each of the examples was obtained by measuring the dynamic viscoelasticity thereof. A dynamic viscoelasticity measuring instrument (instrument name: "ARES" (manufactured by a company TA Instruments) was used to measure each of the pressure-sensitive adhesive layers A and B at a frequency of 1 Hz and a temperature-raising rate of 5° C./minute in a temperature range from −20 to 100° C. In this way, the shearing storage modulus at 23° C. was calculated out.

About the pressure-sensitive adhesive layer A yielded in each of Production Example 4 (A-4) and Production Example 6 (A-6), the layer A was bonded to a cover glass piece, and then the resultant was irradiated (into 3000 mJ/m$^2$) with UVs through the cover glass piece to improve the pressure-sensitive adhesive layer A in crosslinkage degree. Also about the thus yielded pressure-sensitive adhesive layer A', the shearing storage modulus was measured. About each of the pressure-sensitive adhesive layers A and A', the shearing storage modulus was measured in the same manner as described above except that the measuring temperature was changed to 50° C. The results are shown in Table 1.

<Measurement of Peel Strength of Each of Separators>

Any one of the separator-attached (peeling-liner-attached) measuring-samples of each of the working examples and the comparative examples was cut into a sample of 50 mm width and 100 mm length. Subsequently, from the sample, each of the separators (peeling liners) was peeled off at a peeling angle of 180° and a peel rate of 300 mm/min., using a tensile tester. At the peeling time, the peel strength (N/50-mm) was measured. The peel strength of the separator SB (thickness: 38 μm or 50 μm) was 0.10 N/50-m.

The peel strength of the separator SA (thickness: 50 μm or 75 μm) is shown in Table 1.

<Curling>

Any one of the double-sided pressure-sensitive adhesive-layer-attached polarizing films of each of the examples was cut into a rectangle of 70 mm×40 mm in size. The curling quantity thereof was measured about each of the following: the rectangle just after the cutting (at the initial stage); and a sample yielded by putting the rectangle in an environment testing room of 25° C. temperature and 98% relative humidity for 28 hours, taking out the rectangle, and then storing the rectangle on a table in an environment of 25° C. temperature and 50% relative humidity for 2 hours in the state of directing the pressure-sensitive-adhesive-layer-A side of the double-sided pressure-sensitive adhesive-layer-attached polarizing film upward.

The measurement of the curling quantity of the double-sided pressure-sensitive adhesive-layer-attached polarizing film was made in the state of putting the film on a horizontal plane to direct the film surface curled into a convex form downward. Moreover, in the case of measuring the curling quantity in the state of putting the separator SB side of the double-sided pressure-sensitive adhesive-layer-attached polarizing film downward, the measured curling quantity is represented as a "+" value. In the case of measuring the curling quantity in the state of putting the separator SA side of the same film downward, the measured curling quantity is represented as a "−" value. The curling quantity of the film is the distance (mm) of a point farthest from the horizontal plane, out of four corner points of the rectangle, from the plane.

The curling quantity of the double-sided pressure-sensitive adhesive-layer-attached polarizing film was measured also about a sample obtained by peeling off the separator SB (on the pressure-sensitive adhesive layer B side) from the above-mentioned sample, which was stored on the table after being put in the environment testing room.

The curling quantity is controlled into a range preferably from −8 to +8 mm, more preferably from −5 to +5 mm, even more preferably from −2 to +2 mm, even more preferably from −1 to +1 mm from the viewpoint of the operability and the yield of such double-sided pressure-sensitive adhesive-layer-attached polarizing films.

<Endurance: Peel and Foaming>

The double-sided pressure-sensitive adhesive-layer-attached polarizing films yielded in each of the examples, the separator SB (peeling liner) on their pressure-sensitive adhesive layer B was peeled off. A laminator was then used to bond this polarizing film to a cover glass piece (1737, manufactured by Corning Inc.), 0.7 n in thickness, made of non-alkali glass. Next, the resultant was subjected to autoclave treatment at 50° C. and 0.5 MPa for 15 minutes to cause the double-sided pressure-sensitive adhesive-layer-attached polarizing film completely to adhere closely to the non-alkali glass piece. Next, the separator SA (peeling liner) was peeled off therefrom, and a vacuum bonding machine was used to bond the resultant onto a glass plate (manufactured by Matsunami Glass Ind., Ltd.; length: 100 mm, width: 50 mm, and thickness: 0.7 mm) at a vacuum degree of 100 Pa under such a bonding pressure that the plane pressure was 0.2 MPa, so as to bring the pressure-sensitive adhesive layer A into contact the glass plate. In this way, evaluating samples were yielded which each had a structure of the glass piece/the double-sided pressure-sensitive adhesive-layer-attached polarizing film/the glass piece. One of the thus-treated samples was treated in an atmosphere of 85° C. temperature for 240 hours (heating test); another thereof was treated in an atmosphere of 60° C. temperature and 95% relative humidity for 240 hours (humidifying test); and still another thereof was subjected to 100 cycles, any one of which was a cycle of putting the sample in a 85° C. temperature environment and a −40° C. temperature environment for 1 hour (heat shock test: HS test). Thereafter, the external appearance of each of the samples was visually evaluated between the single-side protected polarizing film and the glass piece concerned in accordance with a criterion described below.

(Evaluation Criterion)

⊙: A loupe having a magnification of 20 is used to check a sample, so that the sample is not lowered in external appearance by a peel or foaming.

○: A sample is visually checked so that the sample is not lowered in external appearance by a peel or foaming.

x: A sample is visually checked so that the sample is lowered in external appearance by a peel or foaming.

For reference, Comparative Examples 2 and 3 had no pressure-sensitive adhesive layer A. Thus, no evaluation results thereof were gained.

<Endurance: UV Test>

From any one of the double-sided pressure-sensitive adhesive-layer-attached polarizing films yielded in each of the examples, the separator SA and the separator SB on both surfaces thereof were peeled off. The pressure-sensitive adhesive layers on both the surfaces were then bonded, respectively, onto glass pieces (trade name: "S200200", manufactured by Matsunami Glass Ind., Ltd.; 1.3 mm in thickness×45 mm×50 mm). The resultant was then subjected to autoclaving treatment under an atmospheric pressure of 0.5 MPa at a temperature of 50° C. for 15 minutes. The resultant was used as a sample.

The transmittance (initial) of the sample and that of the sample after the following transmittance (after a reliability test) were each measured: the sample was irradiated with ultraviolet rays having an irradiance of 500 W/cm² (at wavelengths of 300 to 700 nm) from a xenon lamp under an environmental temperature of 60 to 65° C. and an environmental humidity of 50% relative humidity for 100 hours.

The difference (ΔT) between these transmittances was obtained to evaluate the sample in accordance with a criterion described below.

The measurement of the transmittances was made, using an ultraviolet/visible/near infrared ray spectrophotometer (trade name: "V7100", manufactured by JASCO Corp.).

ΔT=transmittance (initial)−transmittance (after the reliability test)

○: ΔT is 3% or less.
Δ: ΔT is more than 3%, and 5% or less.
x: ΔT is more than 5%.

<Method for Evaluating Dent-Absorbing Performance>

From each of the pressure-sensitive adhesive layers prepared in the above-mentioned production examples, a pressure-sensitive adhesive layer A shown in Table 2 was separately prepared, and the resultant was used as a measuring-sample. The measuring-sample was cut into a piece of 50 mm width and 100 mm length. A hand roller was then used to bond the pressure-sensitive adhesive layer A side of the sample onto a non-alkali glass plate (1737, manufactured by Corning Inc.) of 0.7 mm thickness.

Next, from the measuring-sample bonded to the non-alkali glass plate, the peeling liner was peeled off. A vacuum bonding machine was used to bond, onto the resultant, a print-dent-attached glass plate at a vacuum degree of 100 Pa, under a condition that the bonding pressure was a plane pressure of 0.22 MPa, to bring the print-dent-formed surface of the glass plate into contact with the pressure-sensitive adhesive layer A on the above-mentioned glass plate. In this way, an evaluating sample was yielded which had a structure of the glass plate/the pressure-sensitive adhesive layer A/the print-dent-attached glass plate.

The used print-dent-attached glass plate was a glass plate (manufactured by Matsunami Glass Ind., Ltd.; length: 100 mm, width: 50 mm, and thickness: 0.7 mm) having a surface onto which a print was applied to give a printed moiety thickness (print dent height) of 40 μm.

Values (%) "(level-difference/pressure-sensitive-adhesive-layer-thickness)×100", which are indexes showing dent-absorbing performance, are 50% and 80%.

Next, the evaluating sample was put into an autoclave, and then subjected to autoclaving treatment at a temperature of 50° C. under a pressure of 5 atm. for 15 minutes. After the autoclaving treatment, the evaluating sample was taken out to observe visually the state of the bonding between the pressure-sensitive adhesive layer and the print-dent-attached glass plate. The number of air bubbles remaining therein was then measured.

For reference, Comparative Examples 2 and 3 had no pressure-sensitive adhesive layer A. Thus, no evaluation results thereof were gained.

<Reworking>

The double-sided pressure-sensitive adhesive-layer-attached polarizing films yielded in each of the examples were each cut into a piece 140 mm×80 mm in size to make its long sides along an absorption axis of the piece. Thereafter, the separator SB (peeling liner) on the pressure-sensitive adhesive layer B (on the side of the piece that was opposite to the viewer-side thereof) was peeled off. A laminator was used to bond the resultant onto a non-alkali glass piece (1737, manufactured by Corning Inc.) of 0.7 mm thickness. Next, the resultant was subjected to autoclaving treatment at 50° C. and 5 atmospheric pressures for 15 minutes. The thus yielded products were used as samples. About each of the resultant samples, the pressure-sensitive adhesive layer B was peeled off at 300 mm/minute from any one of corners of the sample toward the corner thereof on the diagonal line from the one corner to give a peeling angle of 90°. The proportion of peel-succeeded one or ones in the five samples is shown.

<Edge External Appearance>

◯: after 24 hours elapsed while a temperature of 30° C. was kept after the production (and processing) of the pressure-sensitive adhesive layer A of the double-sided pressure-sensitive-adhesive-layer-attached polarizing film as the measuring sample, no pressure-sensitive adhesive was protruded from the edge of the polarizing film.

x: after 24 hours elapsed while a temperature of 30° C. was kept after the production (and processing) of the pressure-sensitive adhesive layer A of the double-sided pressure-sensitive-adhesive-layer-attached polarizing film, the pressure-sensitive adhesive was protruded from the edge of the polarizing film.

TABLE 2

| | Separator SA Thickness (μm) | Pressure-sensitive adhesive layer A Species | Pressure-sensitive adhesive layer A Thickness (μm) | Storage modulus (MPa) | Dented quantity (μm) | Transparent protective film (1b) on viewer-side Species | Transparent protective film (1b) on viewer-side Thickness (μm) | Polarizer (1a) Species | Polarizer (1a) Thickness (μm) | Functional layer (1c) or transparent protective film on side opposite to viewer-side Species | Functional layer (1c) or transparent protective film on side opposite to viewer-side Thickness (μm) |
|---|---|---|---|---|---|---|---|---|---|---|---|
| Example 1 | 75 | A-1 | 25 | 0.11 | 50 | b-1 | 20 | a-1 | 5 | | |
| Example 2 | 75 | A-1 | 50 | 0.11 | 60 | b-1 | 20 | a-1 | 5 | | |
| Example 3 | 75 | A-1 | 75 | 0.11 | 80 | b-1 | 20 | a-1 | 5 | | |
| Example 4 | 75 | A-1 | 100 | 0.11 | 110 | b-1 | 20 | a-1 | 5 | | |
| Example 5 | 75 | A-1 | 200 | 0.11 | 170 | b-1 | 20 | a-1 | 5 | | |
| Example 6 | 75 | A-2 | 200 | 0.15 | 180 | b-1 | 20 | a-1 | 5 | | |
| Example 7 | 75 | A-1 | 200 | 0.11 | 170 | b-1 | 20 | a-2 | 12 | | |
| Example 8 | 75 | A-1 | 200 | 0.11 | 180 | b-1 | 20 | a-1 | 5 | Functional layer | 2 |
| Example 9 | 75 | A-3 | 200 | 0.14 | 180 | b-1 | 20 | a-1 | 5 | | |
| Example 10 | 75 | A-4 | 100 | 0.07 | 120 | b-1 | 20 | a-1 | 5 | | |
| Example 11 | 75 | A-1 | 200 | 0.11 | 160 | b-2 | 13 | a-1 | 5 | | |
| Example 12 | 75 | A-1 | 200 | 0.11 | 170 | b-1 | 20 | a-1 | 5 | | |
| Example 13 | 50 | A-1 | 200 | 0.11 | 180 | b-1 | 20 | a-1 | 5 | | |
| Example 14 | 75 | A-1 | 200 | 0.11 | 170 | b-1 | 20 | a-1 | 5 | | |
| Example 15 | 75 | A-5 | 100 | 0.15 | 110 | b-1 | 20 | a-1 | 5 | | |
| Example 16 | 75 | A-6 | 100 | 0.05 | 110 | b-1 | 20 | a-1 | 5 | | |
| Example 17 | 75 | A-1 | 200 | 0.11 | 0 | b-1 | 20 | a-1 | 5 | | |
| Comparative Example 1 | 75 | A-1 | 200 | 0.11 | 180 | b-1 | 20 | a-2 | 12 | b-1 | 20 |
| Comparative Example 2 | | | | | | b-1 | 20 | a-1 | 5 | | |
| Comparative Example 3 | | | | | | | | a-1 | 5 | b-1 | 20 |

| | Polarizing film Corona treatment of transparent protective film (1b) surface on viewer-side | Polarizing film Total thickness (μm) | Pressure-sensitive adhesive layer B Species | Pressure-sensitive adhesive layer B Thickness (μm) | Separator SB Thickness (μm) | Curling — Respective separators on both surfaces — Initial stage Curling Direction | Curling — Respective separators on both surfaces — Initial stage quantity (mm) | Curling — Respective separators on both surfaces — Standing-still at 20° C. and 98% RH for 24 hours Curling Direction | Curling — Respective separators on both surfaces — Standing-still at 20° C. and 98% RH for 24 hours quantity (mm) | Curling — Separator SA only on pressure-sensitive adhesive layer A side (after peeling of separator SB) Initial stage Direction |
|---|---|---|---|---|---|---|---|---|---|---|
| Example 1 | Not done | 25 | B-1 | 20 | 38 | + | 2 | − | 4 | + |
| Example 2 | Not done | 25 | B-1 | 20 | 38 | + | 2 | − | 3 | + |
| Example 3 | Not done | 25 | B-1 | 20 | 38 | + | 1 | − | 1 | + |
| Example 4 | Not done | 25 | B-1 | 20 | 38 | + | 1 | − | 2 | + |
| Example 5 | Not done | 25 | B-1 | 20 | 38 | + | 0 | − | 1 | + |
| Example 6 | Not done | 25 | B-1 | 20 | 38 | + | 0 | − | 0 | + |
| Example 7 | Not done | 32 | B-1 | 20 | 38 | + | 3 | − | 5 | + |
| Example 8 | Not done | 27 | B-1 | 20 | 38 | + | 1 | − | 1 | + |
| Example 9 | Not done | 25 | B-1 | 20 | 38 | + | 1 | + | 0 | + |
| Example 10 | Not done | 25 | B-1 | 20 | 38 | + | 1 | − | 1 | + |
| Example 11 | Not done | 18 | B-1 | 20 | 38 | + | 1 | − | 1 | + |
| Example 12 | Not done | 25 | B-1 | 20 | 50 | + | 0 | + | 0 | + |
| Example 13 | Not done | 25 | B-1 | 20 | 38 | + | 2 | − | 2 | + |
| Example 14 | Done | 25 | B-1 | 20 | 38 | + | 1 | − | 1 | + |
| Example 15 | Not done | 25 | B-1 | 20 | 38 | + | 1 | − | 1 | + |
| Example 16 | Not done | 25 | B-1 | 20 | 38 | + | 0 | − | 1 | + |
| Example 17 | Not done | 25 | B-1 | 20 | 38 | + | 0 | + | 0 | + |

TABLE 2-continued

| | | | | | | | | | | |
|---|---|---|---|---|---|---|---|---|---|---|
| Comparative Example 1 | Not done | 52 | B-1 | 20 | 38 | + | 1 | − | 1 | + |
| Comparative Example 2 | Not done | 25 | B-1 | 20 | 38 | + | 10 | − | 5 | + |
| Comparative Example 3 | Not done | 25 | B-1 | 20 | 38 | + | 8 | − | 5 | − |

| | Curling Separator SA only on pressure-sensitive adhesive layer A side (after peeling of separator SB) | | | Endurance Peel and foaming | | | | Absorption of 40-μm dents | Reworking hand | |
|---|---|---|---|---|---|---|---|---|---|---|
| | Initial stage Curling quantity (mm) | Standing-still at 20° C. and 98% RH for 24 hours Direction | Curling quantity (mm) | 85° C. 240 h | 60° C./ 98% RH 240 h | HS 100 cycle | UV UV test | The number of air bubbles after autoclaving | experiment Success proportion | Edge quality |
| Example 1 | 1 | − | 4 | ⊙ | ⊙ | ⊙ | ○ | 7 | 40% | ○ |
| Example 2 | 1 | − | 3 | ⊙ | ⊙ | ⊙ | ○ | 5 | 40% | ○ |
| Example 3 | 0 | − | 3 | ⊙ | ⊙ | ⊙ | ○ | 4 | 100% | ○ |
| Example 4 | 2 | − | 3 | ⊙ | ⊙ | ⊙ | ○ | 3 | 100% | ○ |
| Example 5 | 0 | − | 1 | ⊙ | ⊙ | ⊙ | ○ | 0 | 100% | ○ |
| Example 6 | 0 | + | 0 | ⊙ | ⊙ | ⊙ | ○ | 0 | 100% | ○ |
| Example 7 | 2 | + | 7 | ⊙ | ⊙ | ⊙ | ○ | 0 | 100% | ○ |
| Example 8 | 1 | − | 1 | ⊙ | ⊙ | ⊙ | ○ | 0 | 100% | ○ |
| Example 9 | 1 | − | 1 | ⊙ | ⊙ | ⊙ | ⊙ | 0 | 100% | ○ |
| Example 10 | 1 | − | 1 | ⊙ | ⊙ | ⊙ | ⊙ | 0 | 100% | ○ |
| Example 11 | 1 | − | 1 | ⊙ | ⊙ | ⊙ | ○ | 0 | 100% | ○ |
| Example 12 | 0 | + | 0 | ⊙ | ⊙ | ⊙ | ○ | 0 | 100% | ○ |
| Example 13 | 2 | − | 3 | ⊙ | ⊙ | ⊙ | ○ | 0 | 100% | ○ |
| Example 14 | 1 | − | 1 | ⊙ | ⊙ | ⊙ | ○ | 0 | 100% | ○ |
| Example 15 | 1 | − | 1 | ⊙ | ⊙ | ⊙ | ○ | 0 | 60% | ○ |
| Example 16 | 1 | + | 0 | ⊙ | ⊙ | ⊙ | ○ | 0 | 40% | ○ |
| Example 17 | 0 | + | 0 | ⊙ | ⊙ | ⊙ | ○ | 0 | 100% | X |
| Comparative Example 1 | 2 | − | 3 | ⊙ | ⊙ | ⊙ | ⊙ | 0 | 100% | ○ |
| Comparative Example 2 | 16 | − | 20 | ⊙ | ⊙ | ⊙ | ⊙ | — | 0% | ○ |
| Comparative Example 3 | 8 | − | 28 | ⊙ | ⊙ | ⊙ | ⊙ | — | 0% | ○ |

DESCRIPTION OF REFERENCE SIGNS

1 polarizing film
1a polarizer
1b transparent protective film
1c functional layer
A pressure-sensitive adhesive layer A (viewer side)
B pressure-sensitive adhesive layer B (opposite to the viewer side)
SA separator for pressure-sensitive adhesive layer A (viewer side)
SB separator for pressure-sensitive adhesive layer B (opposite to the viewer side)
C member (touch panel or transparent substrate)
D image display device
2 pressure-sensitive adhesive layer (pressure-sensitive adhesive layer B)
3 transparent conductive layer (antistatic layer)
4 glass substrate
5 liquid crystal layer
6 driving electrode
7 antistatic layer functioning also as a sensor layer
8 driving electrode functioning also as a sensor layer
9 sensor layer

The invention claimed is:

1. A double-sided pressure-sensitive adhesive-layer-attached polarizing film, comprising a polarizing film nearest to a viewer-side of an image display device among at least one polarizing film used in the device, a pressure-sensitive adhesive layer A located on the viewer-side of the polarizing film, and a pressure-sensitive adhesive layer B on a side of the polarizing film that is opposite to the pressure-sensitive adhesive layer A, the pressure-sensitive adhesive layer A being equipped with a separator SA and the pressure-sensitive adhesive layer B being equipped with a separator SB;
  wherein the polarizing film is a single-side protected polarizing film having a polarizer of 15 μm or less thickness and having a transparent protective film on only a single side of the polarizer, and the pressure-sensitive adhesive layer B is located on the polarizer side of the single-side protected polarizing film;
  the pressure-sensitive adhesive layer A has a thickness of 25 μm or more; and
  the pressure-sensitive adhesive layer B has a thickness of 25 μm or less.

2. The double-sided pressure-sensitive adhesive-layer-attached polarizing film according to claim 1, wherein the pressure-sensitive adhesive layer B is bonded directly to the polarizer of the single-side protected polarizing film.

3. The double-sided pressure-sensitive adhesive-layer-attached polarizing film according to claim 1, wherein the pressure-sensitive adhesive layer B is bonded to the polarizer of the single-side protected polarizing film to interpose a functional layer of 15 μm or less thickness between the layer B and the polarizer.

4. The double-sided pressure-sensitive adhesive-layer-attached polarizing film according to claim 1, wherein the pressure-sensitive adhesive layer A has a storage modulus of 0.05 MPa or more at 23° C.

5. The double-sided pressure-sensitive adhesive-layer-attached polarizing film according to claim 1, wherein the edge of the pressure-sensitive adhesive layer A is at least partially positioned inside an end side of the plane of the single-side protected polarizing film.

6. The double-sided pressure-sensitive adhesive-layer-attached polarizing film according to claim 1, wherein the separator SA is higher in peel strength than the separator SB.

7. The double-sided pressure-sensitive adhesive-layer-attached polarizing film according to claim 1, wherein the separator SA has a thickness of 40 μm or more, and further has a separator peel strength of 0.1 N/50-mm or more.

8. The double-sided pressure-sensitive adhesive-layer-attached polarizing film according to claim 1, wherein the transparent protective film of the single-side protected polarizing film, over this transparent protective film the pressure-sensitive adhesive layer A being laminated, is subjected to easy facilitating treatment.

9. The double-sided pressure-sensitive-adhesive-layer-attached polarizing film according to claim 1, wherein the pressure-sensitive adhesive layer A and the pressure-sensitive adhesive layer B each is obtained from an acrylic pressure-sensitive adhesive comprising, as a base polymer, a (meth)acryl-based polymer containing, as a monomer unit, an alkyl (meth)acrylate;
the (meth)acryl-based polymer of the pressure-sensitive adhesive layer A comprises, as the monomer unit, 30% by weight or more of 2-ethylhexyl acrylate; and
the (meth)acryl-based polymer of the pressure-sensitive adhesive layer B comprises, as the monomer unit, butyl acrylate in a most proportion.

10. The double-sided pressure-sensitive-adhesive-layer-attached polarizing film according to claim 1, wherein the pressure-sensitive adhesive layer A and the pressure-sensitive adhesive layer B each is obtained from an acrylic pressure-sensitive adhesive comprising, as a base polymer, a (meth)acryl-based polymer containing an alkyl (meth)acrylate as a monomer unit; and
at least one of the (meth) acryl-based polymer of the pressure-sensitive adhesive layer A, and the (meth) acryl-based polymer of the pressure-sensitive adhesive layer B comprises, as a monomer unit, at least one of (meth)acrylic acid and a cyclic nitrogen-containing monomer.

11. The double-sided pressure-sensitive adhesive-layer-attached polarizing film according to claim 1, wherein the pressure-sensitive adhesive layer A is a layer irradiated with an active energy ray to be increased in storage modulus.

12. The double-sided pressure-sensitive adhesive-layer-attached polarizing film according to claim 1, wherein the pressure-sensitive adhesive layer A comprises an ultraviolet absorbent.

13. An image display device, comprising at least one double-sided pressure-sensitive-adhesive-layer-attached polarizing films;
wherein the double-sided pressure-sensitive-adhesive-layer-attached polarizing film nearest to a viewer-side of an image display device among at least one polarizing film used in the device, is the double-sided-pressure-sensitive-adhesive-layer-attached polarizing film according to claim 1; and
the pressure-sensitive adhesive layer A of the double-sided pressure-sensitive-adhesive-layer-attached polarizing film is positioned at the viewer-side, and the pressure-sensitive adhesive layer B of the double-sided pressure-sensitive-adhesive-layer-attached polarizing film is positioned at a display section side of the device.

14. The image display device according to claim 13, which is applied to an in-cell or on-cell touch-sensor built-in liquid crystal display device.

* * * * *